United States Patent [19]
Yamamoto et al.

[11] Patent Number: 6,057,558
[45] Date of Patent: May 2, 2000

[54] SILICON CARBIDE SEMICONDUCTOR DEVICE AND MANUFACTURING METHOD THEREOF

[75] Inventors: Tsuyoshi Yamamoto; Rajesh Kumar, both of Kariya; Kunihiko Hara, Nukata-gun; Yuichi Takeuchi, Obu; Kazukuni Hara, Kasugai; Masami Naito, Inazawa, all of Japan

[73] Assignee: Denson Corporation, Kariya, Japan

[21] Appl. No.: 09/034,344

[22] Filed: Mar. 4, 1998

[30] Foreign Application Priority Data

| Mar. 5, 1997 | [JP] | Japan | 9-050497 |
| Mar. 5, 1997 | [JP] | Japan | 9-050498 |
| Mar. 5, 1997 | [JP] | Japan | 9-050499 |
| Dec. 25, 1997 | [JP] | Japan | 9-358221 |
| Dec. 25, 1997 | [JP] | Japan | 9-358229 |

[51] Int. Cl.⁷ .................................. H01L 31/0312
[52] U.S. Cl. ............................. 257/77; 257/330
[58] Field of Search ..................................... 257/77

[56] References Cited

U.S. PATENT DOCUMENTS

| 4,754,310 | 6/1988 | Coe . | |
| 5,506,421 | 4/1996 | Palmour . | |
| 5,610,422 | 3/1997 | Yanagiya et al. . | |
| 5,614,749 | 3/1997 | Ueno . | |
| 5,689,128 | 11/1997 | Hshieh et al. | 257/331 |
| 5,693,569 | 12/1997 | Ueno . | |
| 5,773,849 | 6/1998 | Harris et al. | 257/77 |
| 5,973,360 | 10/1999 | Tihanyi | 257/330 |

FOREIGN PATENT DOCUMENTS

| 3-076592 | 12/1991 | Japan . |
| 7-161983 | 6/1995 | Japan . |
| 9-036359 | 2/1997 | Japan . |

*Primary Examiner*—Olik Chaudhuri
*Assistant Examiner*—Douglas A. Wille
*Attorney, Agent, or Firm*—Pillsbury Madison & Sutro LLP

[57] ABSTRACT

In a silicon carbide semiconductor device such as a trench gate type power MOSFET, the film thickness and the impurity concentration of a thin film silicon carbide semiconductor layer formed on a trench side face to constitute an accumulation-type channel-forming region and enable the device to operate with a low gate voltage, low on-resistance and low power loss are set so that on impression of a reverse bias voltage a pn junction between a P-type epitaxial layer and an n⁻-type epitaxial layer undergoes avalanche breakdown before the thin film silicon carbide semiconductor layer undergoes punch-through. By this means it is possible to obtain a target high source-drain withstand voltage.

17 Claims, 17 Drawing Sheets

SILICON CARBIDE SEMICONDUCTOR DEVICE AND MANUFACTURING METHOD THEREOF

CROSS REFERENCE TO RELATED APPLICATION

This application claims the benefit of priority of Japanese Patent Applications No. H. 9-50497, No. H. 9-50498 and No. H. 9-50499 which are filed on Mar. 5, 1997, and No. H. 9-358221 and No. H. 9-358229 which are filed on Dec. 25, 1997, the contents of which are incorporated by reference.

BACKGROUND OF THE INVENTION

1. Field of the Invention

This invention relates to a silicon carbide semiconductor device and to a manufacturing method thereof. A silicon carbide semiconductor device according to the invention can for example be used as an insulated gate type field effect transistor and particularly as a vertical type high-power MOSFET.

2. Description of the Related Art

As a silicon carbide semiconductor device in the related art, a trench gate type power MOSFET having low on-resistance and superior withstand voltage has been proposed (Japanese Patent Application Laid-Open No. H. 7-326755 or Japanese Patent Application Laid-Open No. H. 8-70124).

In this trench gate type power MOSFET, as shown in FIG. 39, a semiconductor substrate 4 is made up of an $n^+$-type monocrystalline silicon carbide (SiC) semiconductor substrate 1, an $n^-$-type epitaxial layer 2 and a p-type epitaxial layer 3. This semiconductor substrate 4 consists of hexagonal system monocrystalline silicon carbide, and its upper face (principal face) is a substantially $(000\bar{1})$ carbon face.

An $n^+$-type source region 5 is formed in a predetermined region of the surface of the p-type epitaxial layer 3, and a trench 7 is formed passing through a predetermined region of the $n^+$-type source region 5. This trench 7 passes through the p-type epitaxial layer 3 as well as the $n^+$-type source region 5, and reaches the $n^-$-type epitaxial layer 2. The trench 7 has a side face 7a perpendicular to the surface of the p-type epitaxial layer 3 and a bottom face 7b parallel with the surface of the p-type epitaxial layer 3.

A gate insulating film (gate oxide film) 9 is formed in the trench 7. The inside of this gate oxide film 9 is filled with a gate electrode layer 10. An interlayer insulating film 11 is disposed on the gate electrode layer 10. On the surface of the $n^+$-type source region 5 including the interlayer insulating film 11 and on the surface of the p-type epitaxial layer 3 a source electrode layer 12 is further formed. This source electrode layer 12 is in contact with both the $n^+$-type source region 5 and the p-type epitaxial layer 3. Also, on the surface of the $n^+$-type silicon carbide semiconductor substrate 1 (the rear surface of the semiconductor substrate 4), a drain electrode layer 13 is formed.

When a positive voltage is impressed on the gate electrode layer 10, the surface of the p-type epitaxial layer 3 at the side face 7a of the trench 7 becomes a channel and a current flows between the source electrode layer 12 and the drain electrode layer 13 through the channel.

The source-drain withstand voltage in the trench gate type power MOSFET described above is determined by the condition at which avalanche breakdown of the pn junction between the p-type epitaxial layer 3 and the $n^-$-type epitaxial layer 2 occurs and the condition at which the p-type epitaxial layer 3 is depleted throughout so that punch-through arises. Since the withstand voltage with respect to punch-through changes with variation in the film thickness of the p-type epitaxial layer, setting it to a predetermined withstand voltage is difficult. Because of this, it is necessary while making the voltage at which avalanche breakdown occurs high to also make sure that avalanche breakdown occurs before punch-through in order to set the withstand voltage to a desired value. To prevent punch-through and also make the voltage at which avalanche breakdown occurs high it is necessary to make the impurity concentration of the p-type epitaxial layer 3 amply high and make the thickness "a" of the region sandwiched between the $n^+$-type source region 5 and the $n^-$-type epitaxial layer 2 amply thick.

However, when the impurity concentration of the p-type epitaxial layer 3 is made high, the gate threshold voltage becomes high, and because the channel mobility falls due to increase in impurity scattering, the on-resistance increases. There is also the problem that when the thickness "a" becomes large, the channel length becomes long and a channel resistance and the on-resistance increase.

To overcome those problems, the present applicant has proposed a semiconductor device wherein as shown in FIG. 40 at the side face 7a of the trench 7 an n-type thin film semiconductor layer 8 of silicon carbide is formed by epitaxial growth on the surfaces of the $n^+$-type source region 5, the p-type epitaxial layer 3 and the $n^-$-type epitaxial layer 2 (Japanese Patent Application Laid-Open No. H. 9-74191).

In this semiconductor device shown in FIG. 40, by using the n-type thin film semiconductor layer 8 as a channel-forming region and applying an electric field to the gate oxide film 9 by impressing a voltage on the gate electrode layer 10, an accumulation-type channel is induced in the n-type thin film semiconductor layer 8 and a current is made to flow between the source electrode layer 12 and the drain electrode layer 13 through the accumulation-type channel.

By thus making the MOSFET operate by means of an accumulation-type channel induced without inverting the conductive type of the channel-forming region, compared to an inverted-type channel MOSFET wherein the conductive type of the channel-forming region is inverted to induce the channel, it is possible to make the MOSFET operate with a low gate voltage.

Also, according to the structure as shown in FIG. 40, it is possible to control independently the impurity concentration of the p-type epitaxial layer 3 and the impurity concentration of the n-type thin film semiconductor layer 8 where the channel is formed. Therefore, it is possible to make the impurity concentration of the p-type epitaxial layer 3 high and to shorten the channel length by making the thickness "a" sandwiched between the $n^+$-type source region 5 and the $n^-$-type epitaxial layer 2 small, and it is thereby possible to obtain a high withstand voltage and also make the on-resistance low.

Also, by making low the impurity concentration of the n-type thin film semiconductor layer 8 in which the channel is formed it is possible to reduce the influence of impurity scattering when carriers flow. As a result, the channel mobility can be made large and it is possible to make the on-resistance small and make power losses small.

Therefore, with the trench gate type power MOSFET shown in FIG. 40 it is possible to obtain a silicon carbide semiconductor device having a high withstand voltage and low power loss.

SUMMARY OF THE INVENTION

However, in the previously proposed trench gate type power MOSFET shown in FIG. 40, the relationships between the film thickness and the impurity concentration of the n-type thin film semiconductor layer 8 and the conductive type of the material constituting the gate electrode layer 10 has not been studied. Depending on these relationships, there is a possibility of being unable to obtain a required source-drain withstand voltage.

It is therefore a first object of the present invention to make it possible to obtain a required high withstand voltage in a case wherein a silicon carbide thin film is formed on the trench side face.

Also, in the trench gate type power MOSFET shown in FIG. 40, it has not been studied what surface orientation of the crystals accumulated in the thin film semiconductor layer 8 is preferable. Depending on this surface orientation, there is a possibility of variation arising in the source-drain withstand voltage and it being impossible to maintain the source-drain withstand voltage at a higher voltage than when the thin film semiconductor layer 8 is not formed.

It is therefore a second object of the invention to reduce dispersion in the source-drain withstand voltage and thereby make it easy to maintain a high source-drain withstand voltage even in a case wherein a silicon carbide thin film is formed on the trench side face.

Further, it has been found that in the trench gate type power MOSFET shown in FIG. 40 there is also a problem of avalanche breakdown occurring at the gate oxide film 9 surface at the bottom of the trench 7 and hot carriers formed being injected into the gate oxide film 9 at the bottom of the trench 7 and thereby the gate oxide film 9 being destroyed.

It is therefore a third object of the invention to prevent destruction of the gate oxide film at the trench bottom.

To achieve the above-mentioned first object, the present inventors carried out the following study.

The withstand voltage of the n-type thin film semiconductor layer 8 can be controlled by utilizing both spreading of a depletion layer occurring due to a static potential difference across the pn junction between the p-type epitaxial layer 3 and the n-type thin film semiconductor layer 8 and spreading of a depletion layer occurring due to a difference in work function between the material constituting the gate electrode layer 10 and silicon carbide (SiC). That is, as a result of the spreading of these depletion layers, the entire n-type thin film semiconductor layer 8 is depleted and a potential barrier is formed in the n-type thin film semiconductor layer 8 between the source and the drain. Due to the potential barrier, the n-type thin film semiconductor layer 8 exhibits withstand voltage.

The size of this potential barrier in the thin film part between the source and the drain in principle varies according to the film thickness and the impurity concentration of the n-type thin film semiconductor layer 8 and the conductive type of the material constituting the gate electrode layer 10. To suppress variation in the source-drain withstand voltage, it is necessary to set the withstand voltage of the n-type thin film semiconductor layer 8 higher than the withstand voltage determined by the p-type epitaxial layer 3 and the n$^-$-type epitaxial layer 2 (this withstand voltage is stable).

To find the conditions for this, the simulation model shown in FIG. 17 was drawn up and calculations were carried out using a MEDICI (TMA Co.) as a device simulator.

In this simulation model, the film thickness of the side face of the gate oxide film 9 was made 60 nm and the impurity concentration and the junction depth of the p-type epitaxial layer 3 and the impurity concentration and the junction depth of the n$^-$-type epitaxial layer 2 were set so that the withstand voltage of a body diode formed by the p-type epitaxial layer 3 and the n$^-$-type epitaxial layer 2 was 1000V. The dielectric constant of SiC was taken as 10.0, its electron affinity as 4.3 eV and its band gap as 2.9V, the drain current was made $5 \times 10^{-10}$ A/$\mu$m (current per a channel width) and the temperature T was made 623K.

Calculation results for the withstand voltage of the n-type thin film semiconductor layer 8 vs. the film thickness of the n-type thin film semiconductor layer 8 for different impurity concentrations are shown in FIG. 18 and FIG. 19. FIG. 18 shows a case wherein p-type polysilicon was used for the gate electrode layer 10 and FIG. 19 shows a case wherein n-type polysilicon was used for the gate electrode layer 10, and the ○, △ and □ symbols in the figures correspond to different impurity concentrations.

Where the withstand voltage is constant with respect to change in the film thickness of the n-type thin film semiconductor layer 8, the source-drain withstand voltage is being determined by the withstand voltage of the above-mentioned body diode (1000V). Where the withstand voltage decreases rapidly with increase in the film thickness of the n-type thin film semiconductor layer 8, the source-drain withstand voltage is being determined by punch-through of the n-type thin film semiconductor layer 8. In other words, where the withstand voltage is fixed at 1000V, the pn junction between the n$^-$-type epitaxial layer 2 and the p-type epitaxial layer 3 is undergoing avalanche breakdown before the n-type thin film semiconductor layer 8 undergoes punch-through.

In the case wherein p-type polysilicon was used for the gate electrode layer 10, it can be found from FIG. 18 that the withstand voltage suddenly starts to decrease when the film thickness X($\mu$m), the impurity concentration N(cm$^{-3}$) and the withstand voltage Y(V) of the n-type thin film semiconductor layer 8 satisfy the relationship Y=−10000{(X−0.8)+ 0.3(logN−15)}.

In the case wherein n-type polysilicon was used for the gate electrode layer 10, it can be found from FIG. 19 that the withstand voltage suddenly starts to decrease when the film thickness X($\mu$m), the impurity concentration N(cm$^{-3}$) and the withstand voltage Y(V) of the n-type thin film semiconductor layer 8 satisfy the relationship Y=−10000{(X−0.6)+ 0.3(logN−15)}.

Therefore, if the film thickness and the impurity concentration of the n-type thin film semiconductor layer 8 are set on the basis of these relationships, it is possible to obtain a target source-drain withstand voltage.

The present invention was made on the basis of the study described above, and in accordance with the invention the film thickness and the impurity concentration of a second semiconductor layer consisting of a silicon carbide thin film formed on a trench side face are set so that on impression of a reverse bias voltage a pn junction between a high-resistance semiconductor layer and a first semiconductor layer constituting a semiconductor substrate undergoes avalanche breakdown before the second semiconductor layer undergoes punch-through. By this means it is possible to obtain a target high source-drain withstand voltage.

When the gate electrode layer is made a second conductive type, the film thickness X($\mu$m) and the impurity concentration N(cm$^{-3}$) of the second semiconductor layer are set with respect to the withstand voltage Y(V) so as to satisfy the relationship Y<−10000{(X−0.8)+0.3(logN−15)}. When the gate electrode layer is made a first conductive type, the film thickness X(μm) and the impurity concentration N(cm$^{-3}$) of the second semiconductor layer are set with respect to the withstand voltage Y(V) so as to satisfy the relationship Y<−10000{(X−0.6)+0.3(logN−15)}.

To achieve the second object of the invention, the inventors made and studied trench gate type power MOSFETs having different surface orientations of the surface of the thin film semiconductor layer, i.e. the surface where a channel is formed.

When the trench was made a shape consisting of a plurality of trench side faces parallel with the approximate [11$\bar{2}$0] direction and a thin film semiconductor layer was formed on the trench side faces, the surface orientation of the surface of the thin film semiconductor layer was substantially {1$\bar{1}$00}. When the trench was made a shape consisting of a plurality of faces parallel with the approximate [1$\bar{1}$00] direction and a thin film semiconductor layer was formed on the trench side faces, the surface orientation of the surface of the thin film semiconductor layer was substantially {11$\bar{2}$}.

The two surface orientations mentioned above are typical surface orientations of the surface of the thin film semiconductor layer, and studies were carried out on both of them. Whereas with the former, although there are fewer irregularities in the surface shape, there was dispersion in the source-drain withstand voltage from wafer to wafer and over the wafer surface, with the latter there was no dispersion in the source-drain withstand voltage among wafers or over the wafer surface and it was possible to easily maintain a withstand voltage equal to the withstand voltage of a case wherein the thin film semiconductor layer is not formed (design withstand voltage).

A study of this result was carried out based on a simulation showing the relationship between the impurity concentration of the thin film semiconductor layer and the source-drain withstand voltage. In FIG. 20, an example of the impurity concentration dependency of the source-drain withstand voltage predicted from the simulation for a case wherein a thin film semiconductor layer of a fixed film thickness of 250 nm was added to a trench gate type power MOSFET whose source-drain withstand voltage was 1000V is shown.

As shown in FIG. 20, at impurity concentrations of the thin film semiconductor layer below 7×10$^{15}$ cm$^{-3}$ the 1000V that is the withstand voltage of when the thin film semiconductor layer is not formed is maintained. But if the impurity concentration increases even slightly from 7×10$^{15}$ cm$^{-3}$ the withstand voltage decreases rapidly. When the impurity concentration exceeds 2×10$^{16}$ cm$^{-3}$, the withstand voltage becomes substantially 0V. Therefore, if the impurity concentration of the thin film semiconductor layer is below 7×10$^{15}$ cm$^{-3}$ it is possible to maintain the withstand voltage at the design withstand voltage of 1000V. Further, even if for some reason there is a measure of dispersion in the impurity concentration, dispersion does not arise in the withstand voltage. When on the other hand the center value of the impurity concentration of the thin film semiconductor layer is around 1×10$^{16}$ cm$^{-3}$, if for some reason the impurity concentration varies then the withstand voltage will vary over a wide range. This range of variation in the withstand voltage is determined by the range of the variation in the impurity concentration.

When the channel face of the thin film semiconductor layer is made a substantially {11$\bar{2}$0} face, since the source-drain withstand voltage is maintained at the design withstand voltage, it can be supposed that the center value of the impurity concentration of the thin film semiconductor layer is in a concentration region low enough for the design withstand voltage to be maintained. When the channel face of the thin film semiconductor layer is made a substantially {1$\bar{1}$00} face, since the center value of the impurity concentration of the thin film semiconductor layer is a higher concentration than when the channel face is made substantially {11$\bar{2}$0} face, it can be supposed that the center value is right in a withstand voltage transition region.

With a structure wherein between a p-type epitaxial layer and a gate oxide film is disposed a thin film semiconductor layer having a different impurity concentration from the p-type epitaxial layer, to maintain the source-drain withstand voltage to the design value it is essential that the impurity concentration of the thin film semiconductor layer be a low concentration. When the channel face of this thin film semiconductor layer is a substantially {11$\bar{2}$0} face, the impurity concentration of the thin film semiconductor layer can easily be made a low concentration. As a result, it is possible to obtain a trench gate type power MOSFET having a high withstand voltage and with no dispersion therein among wafers or over the wafer surface.

According to a silicon carbide semiconductor device provided by the present invention and devised on the basis of the studies described above, in a trench gate type power MOSFET wherein a thin film semiconductor layer of silicon carbide (a second semiconductor layer) is formed on the side face of a trench passing through a first semiconductor layer, the trench is made a shape having a side face substantially parallel with the [1$\bar{1}$00] direction and the second semiconductor layer is formed on the trench side face.

Because the surface orientation of the second semiconductor layer thus becomes substantially {11$\bar{2}$0}, it becomes easy to make the concentration of the second semiconductor layer low and it is possible to maintain the source-drain withstand voltage at a withstand voltage equal to that of a case wherein the second semiconductor layer is not formed.

In this case, if the trench shape is made a hexagon of which the internal angles are substantially equal, the angle formed by adjacent trench side faces becomes about 120°, and even when a high voltage is impressed across the source and the drain when the device is off, avalanche breakdown due to electric field concentrations does not occur in the regions formed by adjacent trench side faces. Therefore, in withstand voltage design of the source-drain withstand voltage, because it is sufficient to consider the withstand voltage determined by the impurity concentrations and the film thicknesses of the high-resistance semiconductor layer and the first semiconductor layer, high withstand voltage design becomes easy.

Also, when the high-resistance semiconductor layer and the second semiconductor layer are made a first conductive type and the first semiconductor layer is made a second conductive type, the device can be made to operate by means of an accumulation-type channel induced without the conductive type of a channel-forming layer being inverted.

For example when the film thickness of the second semiconductor layer is 250 nm or more, if its impurity concentration is made less than 7×10$^{15}$ cm$^{-3}$ it is possible to obtain a withstand voltage equal to that of a device wherein the second semiconductor layer is not formed.

The trench of the trench gate type power MOSFET described above is formed using dry etching. When dry etching is used, due to ion impacts during the etching, crystal defects arise in the vicinity of the trench surface and irregularities in the etched surface become large; however, by forming a second semiconductor layer on the trench surface by epitaxial growth, because in the second semiconductor layer there are no crystal defects caused by ion impacts, it is possible to increase the channel mobility in the channel region. Also, because the irregularities in the surface of the second semiconductor layer are small it is possible to make uniform the film thickness of a gate oxide film formed by thermally oxidizing the second semiconductor layer. Further, because local electric field concentrations do not arise the gate oxide film withstand voltage increases. As a result, it is possible to obtain a highly reliable silicon carbide semiconductor device with a long gate oxide film life.

Also, by making the crystal type of the second semiconductor layer the same as the crystal type of the first semiconductor layer, it is possible to form the second semiconductor layer easily.

To achieve the above-mentioned third object of the invention, the silicon carbide semiconductor device is so constructed that when a reverse bias voltage is impressed on the pn junction between first and second semiconductor electrodes (between the source and drain), the pn junction between the high-resistance semiconductor layer of the first conductive type and the first semiconductor layer of the second conductive type becomes conductive before the surface of the gate oxide film at the bottom of the trench undergoes avalanche breakdown.

By the pn junction between the high-resistance semiconductor layer of the first conductive type and the first semiconductor layer of the second conductive type becoming conductive first, it is possible to prevent destruction of the gate oxide film at the bottom of the trench.

Becoming conductive refers to going into a state of avalanche breakdown or a state of punch-through, as will be further discussed later.

Preferably, a second low-resistance semiconductor layer of the first conductive type is interposed between the high-resistance semiconductor layer of the first conductive type and the first semiconductor layer of the second conductive type. By interposing the second low-resistance semiconductor layer in this way, it is possible to make the first semiconductor layer and the second low-resistance semiconductor layer conductive before the surface of the gate oxide film at the bottom of the trench undergoes avalanche breakdown.

In this case, the film thickness and the impurity concentration of the second low-resistance semiconductor layer can be set so that when a reverse bias voltage is impressed on the pn junction between the second electrode and the first electrode the pn junction between the second low-resistance semiconductor layer and the first semiconductor layer undergoes avalanche breakdown before the surface of the gate oxide film at the bottom of the trench undergoes avalanche breakdown. That is, by interposing the second low-resistance semiconductor layer it is possible to reduce the reverse withstand voltage of the pn junction between the high-resistance semiconductor layer and the first semiconductor layer and make that pn junction undergo avalanche breakdown first.

Also, the high-resistance semiconductor layer is preferably set to a thickness such that when the pn junction between the high-resistance semiconductor layer and the first semiconductor layer has become conductive a depletion layer extending from the gate oxide film toward a first low-resistance semiconductor layer which is disposed via the high-resistance semiconductor layer does not reach the first low-resistance semiconductor layer.

That is, if the high-resistance semiconductor layer is set to a thickness such that when the electric field due to the reverse bias voltage has reached a critical field strength at which the pn junction of the high-resistance semiconductor layer and the first semiconductor layer undergoes avalanche breakdown the depletion layer extending from the gate oxide film toward the first low-resistance semiconductor layer does not reach the first low-resistance semiconductor layer, the pn junction of the high-resistance semiconductor layer and the first semiconductor layer can be made to undergo avalanche breakdown first.

Also, if an embedded semiconductor layer away from the trench and in contact with the first semiconductor layer is formed in the high-resistance semiconductor layer, it is possible to raise the electric field strength and make avalanche breakdown occur at a corner part formed by the embedded semiconductor layer and the high-resistance semiconductor layer and thereby prevent destruction of the gate oxide film at the bottom of the trench.

DETAILED DESCRIPTION OF THE PREFERRED EMBODIMENTS

Figure 1:
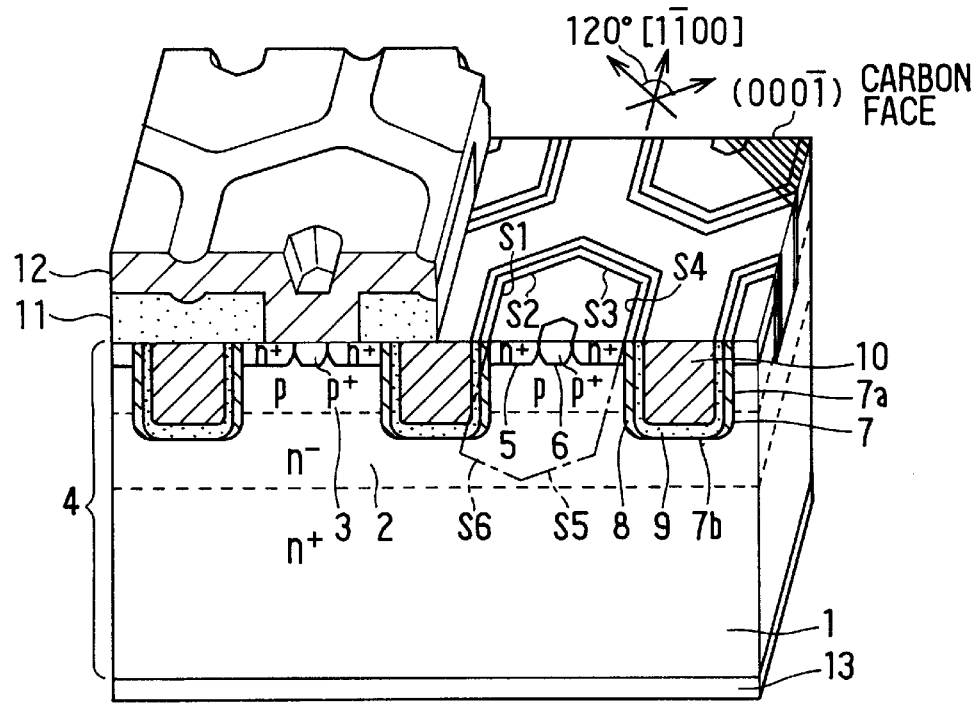
FIG. 1 is a perspective view of a trench gate type power MOSFET according to a first preferred embodiment of the invention.

A first preferred embodiment of the invention will now be described. FIG. 1 shows an n-channel type trench gate power MOSFET (vertical type power MOSFET) of this preferred embodiment.

An $n^+$-type silicon carbide semiconductor substrate 1 serving as a low-resistance semiconductor layer consists of hexagonal silicon carbide. On this $n^+$-type silicon carbide semiconductor substrate 1 are successively layered an $n^-$-type silicon carbide semiconductor layer ($n^-$-type epitaxial layer) 2 as a high-resistance semiconductor layer and a p-type silicon carbide semiconductor layer (p-type epitaxial layer) 3 as a first semiconductor layer. In this way, a semiconductor substrate 4 consisting of monocrystalline silicon carbide is made up of the $n^+$-type silicon carbide semiconductor substrate 1, the $n^-$-type epitaxial layer 2 and the p-type epitaxial layer 3, and the upper face of this semiconductor substrate 4 is a substantially (000$\bar{1}$) carbon face.

An $n^+$-type source region 5 is formed as a semiconductor region in a predetermined region of the surface of the p-type epitaxial layer 3. Also, a low-resistance p-type silicon carbide region 6 is formed in the surface of the p-type epitaxial layer 3 in a predetermined region surrounded by the $n^+$-type source region 5.

A trench 7 is formed in a predetermined region of the $n^+$-type source region 5, and this trench 7 passes through the $n^+$-type source region 5 and the p-type epitaxial layer 3 and reaches the $n^-$-type epitaxial layer 2. The trench 7 has a side face 7a perpendicular to the surface of the semiconductor substrate 4 and a bottom face 7b parallel with the surface of the semiconductor substrate 4.

The side face 7a of the trench 7 extends in the approximate [1$\bar{1}$00] direction. Here, the [1$\bar{1}$00] direction refers generically to the six directions <1$\bar{1}$00>, <10$\bar{1}$0>, <01$\bar{1}$0>, <$\bar{1}$100>, <$\bar{1}$0$\bar{1}$0>, <0$\bar{1}$1$\bar{0}$>. The side face 7a of the trench 7 is made up of a plurality of faces parallel with the approximate [1$\bar{1}$00] direction.

The plan shape of the side face 7a is that of a hexagon having all its internal angles substantially equal. That is, as shown in the plan view of the semiconductor substrate 4 of FIG. 2, of the six sides of the hexagon S1, S2, S3, S4, S5, S6, the angle (internal) made by the sides S1 and S2, the angle (internal) made by the sides S2 and S3, the angle (internal) made by the sides S3 and S4, the angle (internal) made by the sides S4 and S5, the angle (internal) made by the sides S5 and S6 and the angle (internal) made by the sides S6 and S1 are approximately 120°.

An n-type thin film semiconductor layer of silicon carbide 8 extends over the surfaces of the $n^+$-type source region 5, the p-type epitaxial layer 3 and the $n^-$-type epitaxial layer 2 at the side face 7a of the trench 7 of FIG. 1. The n-type thin film semiconductor layer 8 consists of a thin film of thickness approximately 1000 to 5000 Å. The crystal type of the n-type thin film semiconductor layer 8 is the same as the crystal type of the p-type epitaxial layer 3, and is for example 6H-SiC. Instead of this it may alternatively be 4H-SiC or 3C-SiC. The impurity concentration of the n-type thin film semiconductor layer 8 is lower than the impurity concentrations of the $n^+$-type silicon carbide semiconductor substrate 1 and the $n^+$-type source region 5.

A gate oxide film 9 is formed on the surface of the n-type thin film semiconductor layer 8 and the bottom face 7b of the trench 7. The inside of the gate oxide film 9 in the trench 7 is filled with a gate electrode layer 10. The gate electrode layer 10 is covered with an interlayer insulating film 11. A source electrode layer 12 constituting a first electrode layer is formed on the surface of the $n^+$-type source region 5 and the surface of the low-resistance p-type silicon carbide region 6. A drain electrode layer 13 constituting a second electrode layer is formed on the surface of the $n^+$-type silicon carbide semiconductor substrate 1 (the rear side of the semiconductor substrate 4).

As the operation of this trench gate type power MOSFET, when a positive voltage is impressed on the gate electrode layer 10, an accumulation-type channel is induced in the n-type thin film semiconductor layer 8, and carriers flow between the source electrode layer 12 and the drain electrode layer 13 through this accumulation-type channel. That is, the n-type thin film semiconductor layer 8 serves as a channel-forming region.

By thus making the MOSFET operate by means of an accumulation-type channel induced without inverting the conductive type of the channel-forming region, compared to an inverted-type channel MOSFET wherein the conductive type of the channel-forming region is inverted to induce the channel, it is possible to make the MOSFET operate with a low gate voltage. It is also possible to increase the channel mobility, power loss is low, and the gate threshold voltage decreases. Also, source-drain current control of when a gate voltage is not being impressed is carried out by means of spreading of a depletion layer of the pn junction formed by the p-type epitaxial layer 3 (a body layer) and the n-type thin film semiconductor layer 8 (a channel-forming layer) and by means of spreading of a depletion layer occurring due to a difference in work function between the material constituting the gate electrode layer 10 and silicon carbide (SiC). A 'normally off' characteristic can be achieved by completely depleting the n-type thin film semiconductor layer 8.

Since the p-type epitaxial layer 3 (body layer) and the n$^-$-type epitaxial layer 2 (a drift layer) form a pn junction, the device can be designed so that its withstand voltage is determined by avalanche breakdown of the pn junction between the p-type epitaxial layer 3 fixed to the source electrode and the n$^-$-type epitaxial layer 2, and therefore the resistance to destruction of the device can be made large. That is, this can be done by so constructing the device that when a large positive voltage (for example noise or a back voltage arising when an inductive load is switched) is impressed on a the drain side, i.e. when a reverse bias voltage is impressed on the pn junction between the source and the drain, before the n-type thin film semiconductor layer 8 between the n$^-$-type epitaxial layer 2 and the n$^+$-type source region 5 is punched through by the high voltage on the drain side, the pn junction between the n$^-$-type epitaxial layer 2 and the p-type epitaxial layer 3 undergoes avalanche breakdown at a lower voltage than the voltage at which the above-mentioned punch-through occurs.

Figure 18:
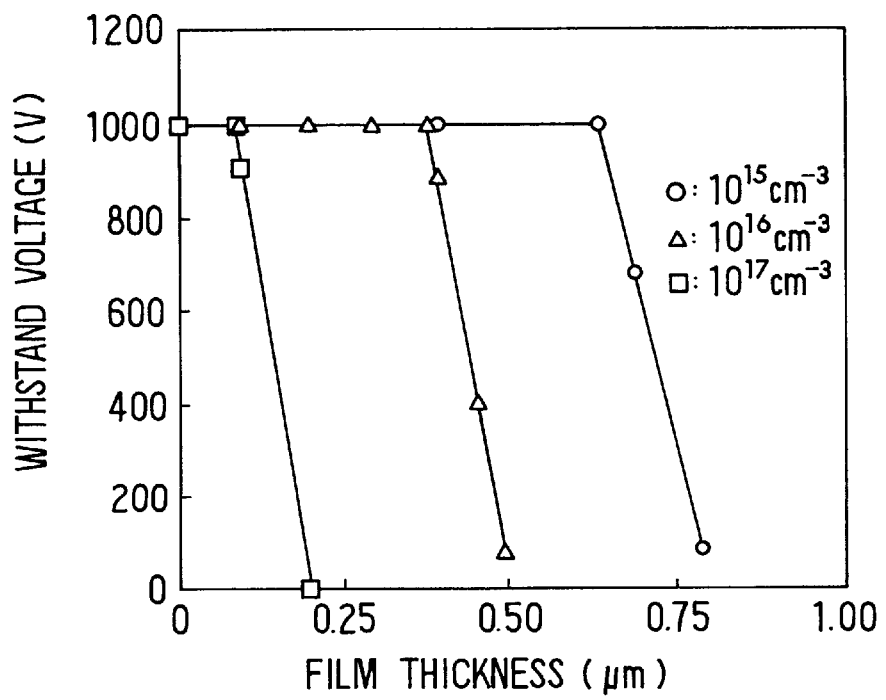
FIG. 18 is a view showing calculation results of withstand voltage vs. film thickness of an n-type thin film semiconductor layer 8 for different impurity concentrations thereof in a case wherein p-type polysilicon is used for a gate electrode layer 10.
Figure 19:
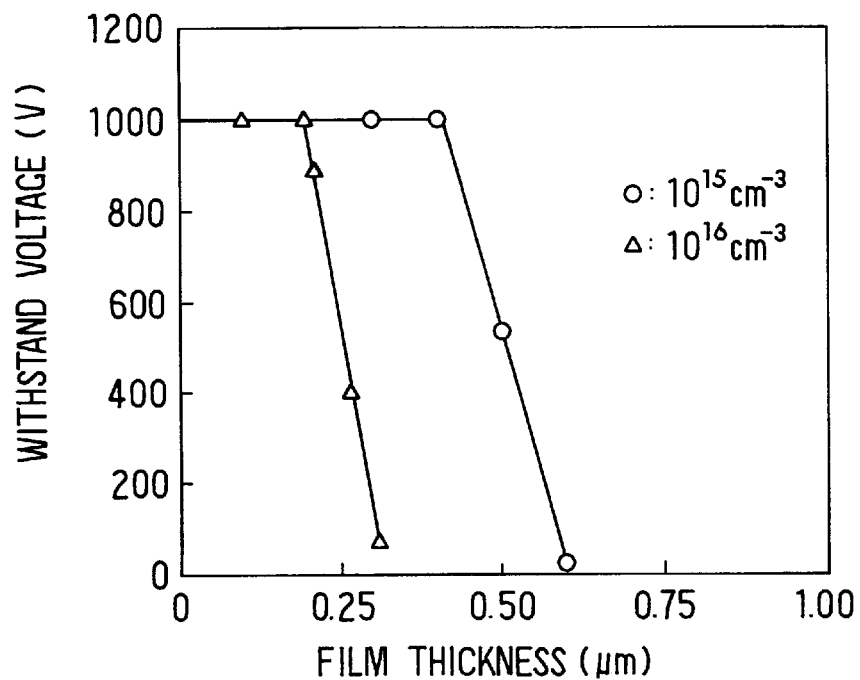
FIG. 19 is a view showing calculation results of withstand voltage vs. film thickness of an n-type thin film semiconductor layer 8 for different impurity concentrations thereof in a case wherein n-type polysilicon is used for the gate electrode layer 10.

The regions where the withstand voltage changes sharply in the graphs of FIG. 18 and FIG. 19 show the withstand voltage being determined by punch-through of the n-type thin film semiconductor layer 8. In the regions where the withstand voltage is 1000V, the above-mentioned voltage causing avalanche breakdown is lower than the voltage at which the n-type thin film semiconductor layer 8 suffers punch-through. From these two graphs it can be seen that to determine the withstand voltage of a SiC power MOSFET with avalanche breakdown of the pn junction between the n$^-$-type epitaxial layer 2 and the p-type epitaxial layer 3 it is necessary to make the thickness of the n-type thin film semiconductor layer 8 thinner the greater its impurity concentration is.

Besides setting the n-type thin film semiconductor layer 8 as shown in FIG. 18 and FIG. 19, it is also possible to determine the withstand voltage of the SiC power MOSFET with avalanche breakdown of the pn junction between the n$^-$-type epitaxial layer 2 and the p-type epitaxial layer 3 for example by changing the impurity concentrations of the n$^-$-type epitaxial layer 2 and the p-type epitaxial layer 3.

Also, by controlling the impurity concentration of the p-type epitaxial layer 3 and the impurity concentration of the n-type thin film semiconductor layer 8 independently it is possible to make a MOSFET with a high withstand voltage, low power loss and a low gate threshold voltage. In particular, if the impurity concentration of the n-type thin film semiconductor layer 8 in which the channel is formed is reduced, the influence of impurity scattering in carrier flow decreases and it is possible to increase the channel mobility. Since the source-drain withstand voltage is mainly governed by the impurity concentrations and the film thicknesses of the n$^-$-type epitaxial layer 2 and the p-type epitaxial layer 3, it is possible to raise the impurity concentration of the p-type epitaxial layer 3 and shorten the distance sandwiched between the high-resistance semiconductor layer and the source semiconductor region. As a result, it is possible to make the channel length short while maintaining a high withstand voltage. Therefore, the channel resistance can be greatly reduced and it is possible to lower the source-drain on-resistance.

Next, a process for manufacturing the trench gate type power MOSFET will be described using FIG. 3 through FIG. 14.

Figure 3:
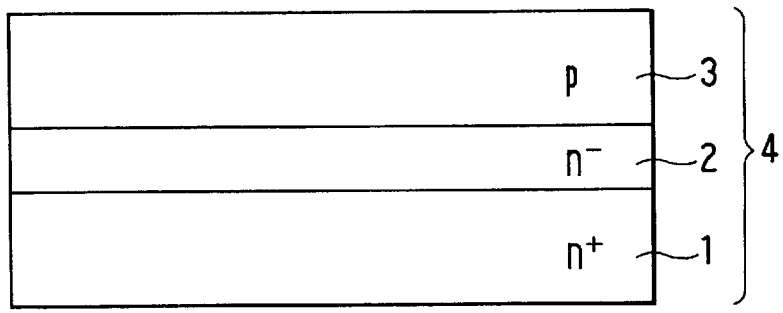
FIGS. 3 through 9 are sectional views illustrating a process for manufacturing the trench gate type power MOSFET shown in FIG. 1.

First, as shown in FIG. 3, an n$^+$-type silicon carbide semiconductor substrate 1 whose principal surface is a (000$\bar{1}$) carbon face is prepared. On the surface of the n$^+$-type silicon carbide semiconductor substrate 1, an n$^-$-type epitaxial layer 2 is epitaxially grown, and on the n$^-$-type epitaxial layer 2 a p-type epitaxial layer 3 is epitaxially grown. In this way, a semiconductor substrate 4 made up of the n$^+$-type silicon carbide semiconductor substrate 1, the n$^-$-type epitaxial layer 2 and the p-type epitaxial layer 3 is formed. The n$^-$-type epitaxial layer 2 and the p-type epitaxial layer 3 are formed with the crystal axis of the n$^+$-type silicon carbide semiconductor substrate 1 inclined about 3.5° to 8°, and consequently the surface orientation of the principal surface of the semiconductor substrate 4 is an approximate (000$\bar{1}$) carbon face.

Figure 4:
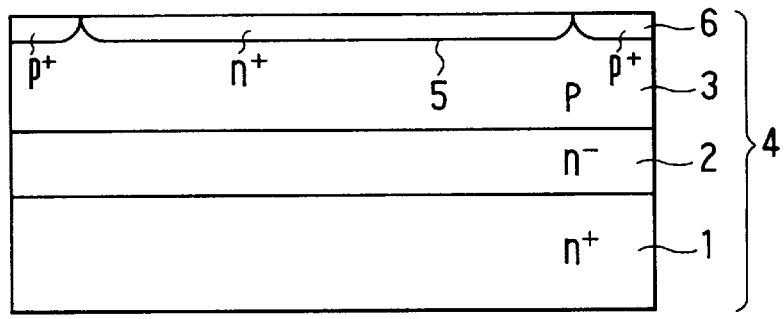

Next, as shown in FIG. 4, an n$^+$-type source region 5 is formed in a predetermined region of the surface of the p-type epitaxial layer 3 for example by ion implantation of nitrogen. Also, a low-resistance p-type silicon carbide region 6 is formed in another predetermined region of the surface of the p-type epitaxial layer 3 for example by ion implantation of aluminum.

Figure 2:
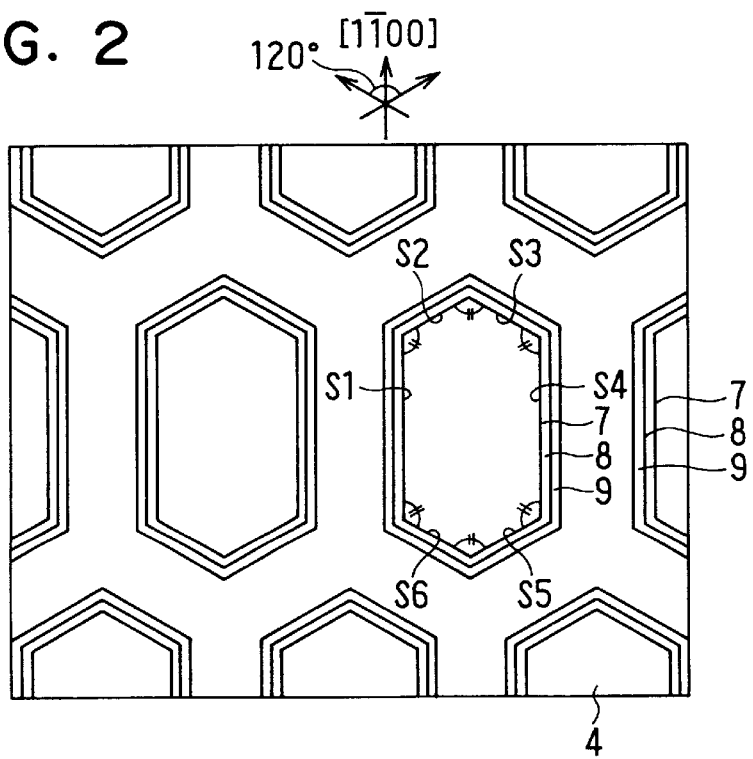
FIG. 2 is a plan view of a semiconductor substrate 4 shown in FIG. 1.
Figure 5:
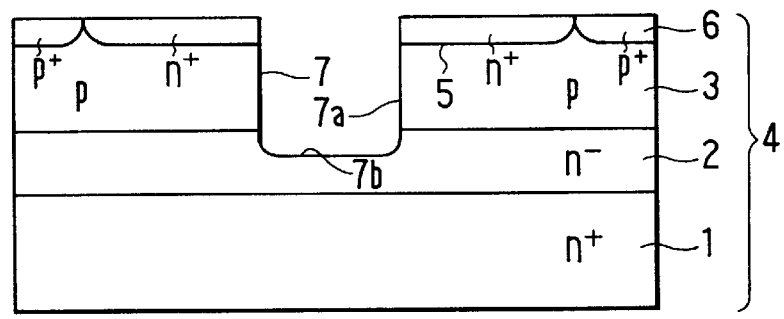

Then, as shown in FIG. 5, by using as a dry etching method RIE (Reactive Ion Etching), a trench 7 passing through the n$^+$-type source region 5 and the p-type epitaxial layer 3 and reaching the n$^-$-type epitaxial layer 2 is formed. At this time, the trench 7 is so formed that a side face 7a of the trench 7 is parallel with the approximate [1$\bar{1}$00] direction. Consequently, as shown in FIG. 2, the plan shape of the side face 7a of the trench 7 as seen from above is a hexagon whose internal angles are all substantially equal.

Figure 6:
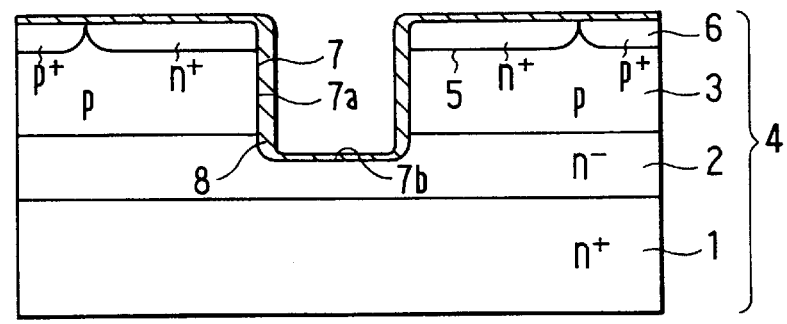

Also, as shown in FIG. 6, an n-type thin film semiconductor layer 8 is formed by epitaxial growth on the upper face of the semiconductor substrate 4 including the inner walls (the side face 7a and the bottom face 7b) of the trench 7. Specifically, by CVD (chemical vapor deposition), a thin film layer of 6H-SiC is formed on 6H-SiC by homo-epitaxial growth to form an n-type thin film semiconductor layer 8 extending over the surfaces of the n$^+$-type source region 5, the p-type epitaxial layer 3 and the n$^-$-type epitaxial layer 2 at the inner walls of the trench 7.

At this time, because the epitaxial growth rate in a direction perpendicular thereto is 8 to 10 times or more faster than the epitaxial growth rate on the (000$\bar{1}$) carbon face, it is possible to form the n-type thin film semiconductor layer 8 thickly on the side face 7a and thinly on the bottom face 7b. Also, here, the film thickness X($\mu$m) and the impurity concentration N(cm$^{-3}$) of the second semiconductor layer 8 on the side face 7a are set with respect to the target source-drain withstand voltage Y(V) so as to satisfy the relationship Y<−10000{(X−0.8)+0.3(logN−15)} when the gate electrode layer 10 is p-type polysilicon and so as to satisfy the relationship Y<−10000{(X−0.6)+0.3(logN−15)} when the gate electrode layer 10 is n-type polysilicon.

In the step of forming this n-type thin film semiconductor layer 8, the n-type thin film semiconductor layer 8 as it grows reduces surface irregularities having arisen as a result of the step of forming the trench. Consequently, the surface of the channel-forming region is a flat face and the channel mobility increases. Also, because in the n-type thin film semiconductor layer 8 there are no crystal defects arising due to ion impacts of RIE, mobility decrease is prevented and it is possible to reduce the on-resistance between the source and the drain.

Figure 7:
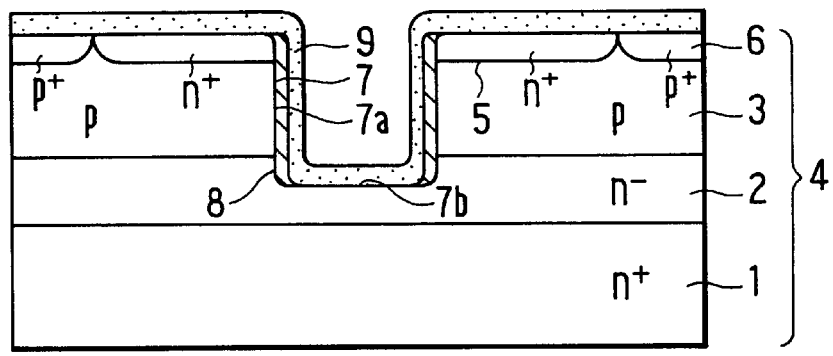

Then, as shown in FIG. 7, by thermal oxidation a gate oxide film (thermal oxide film) 9 is formed on the surfaces of the semiconductor substrate 4 and the n-type thin film semiconductor layer 8 and on the bottom face 7b of the trench 7. At this time, the thermal oxide film is thin on the side face 7a and is thick on the substrate surface and on the trench bottom face 7b. At this time, the thin film semiconductor layer 8 formed by epitaxial growth on the semiconductor substrate 4 surface and on the trench bottom face 7b becomes oxide film. This is because the oxidation rate of the hexagonal silicon carbide is fastest at the (000$\bar{1}$) carbon face, and is about five times as fast as at a face perpendicular to the (000$\bar{1}$) carbon face. In this way, the epitaxially grown ntype thin film semiconductor layer 8 on the semiconductor substrate 4 surface and on the trench bottom face 7b is oxidized and the n-type thin film semiconductor layer 8 only remains on the trench side face 7a.

In this step of forming the gate oxide film 9, because as mentioned above the surface of the channel-forming region is flat, the film thickness of the gate oxide film 9 formed on the channel-forming region surface can also be made uniform. As a result, in the completed MOSFET, there are no local electric field concentrations when a gate voltage is impressed. Because of this, the gate oxide film withstand voltage is increased. Also, for the same reason, the life of the gate oxide film is extended.

Figure 8:
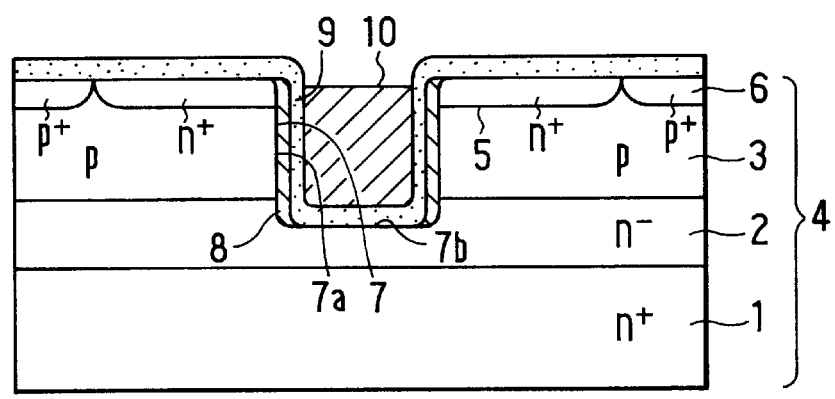
Figure 9:
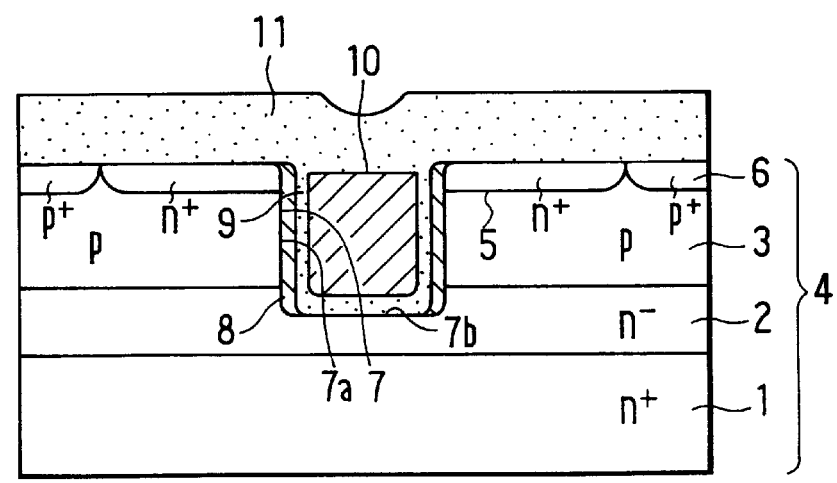

Then, as shown in FIG. 8, the inside of the gate oxide film 9 in the trench 7 is filled with a gate electrode layer 10. As the material constituting this gate electrode layer 10, p-type polysilicon or n-type polysilicon is used. Also, as shown in FIG. 9, an interlayer insulating film 11 is formed on the upper surface of the gate electrode layer 10. After that, as shown in FIG. 1, a source electrode layer 12 is formed on the n$^+$-type source region 5, the interlayer insulating film 11 and the low-resistance p-type silicon carbide region 6. Also, a drain electrode layer 13 is formed on the surface of the n$^+$-type silicon carbide semiconductor substrate 1, and the trench gate type power MOSFET is thereby completed.

In the preferred embodiment described above, because the side face 7a of the trench 7 is made up of a plurality of faces parallel with the approximate [1$\bar{1}$00] direction, the surface orientation of the surface of the thin film semiconductor layer 8 formed on this side face 7a is an approximate {11$\bar{2}$0} face. This {11$\bar{2}$0} face generically refers to the six faces (2$\bar{1}\bar{1}$0), (11$\bar{2}$0), ($\bar{1}$2$\bar{1}$0), ($\bar{2}$110), (11$\bar{2}$ 0) and (12$\bar{1}$0). In this trench gate type power MOSFET, because the channel is formed in the thin film semiconductor layer 8, the channel-forming region surface is an approximate {11$\bar{2}$0} face.

It is also possible for the side face 7a of the trench 7 to be made up of a plurality of faces parallel with the approximate [11$\bar{2}$0] direction. In this case, the surface orientation of the surface of the thin film semiconductor layer 8 becomes a substantially {1$\bar{1}$00} face.

For each of these cases the influence on the source-drain withstand voltage was studied. As a result it was found that the source-drain withstand voltage can be maintained better when the surface orientation of the surface of the thin film semiconductor layer 8 is substantially {11$\bar{2}$0}.

Figure 20:
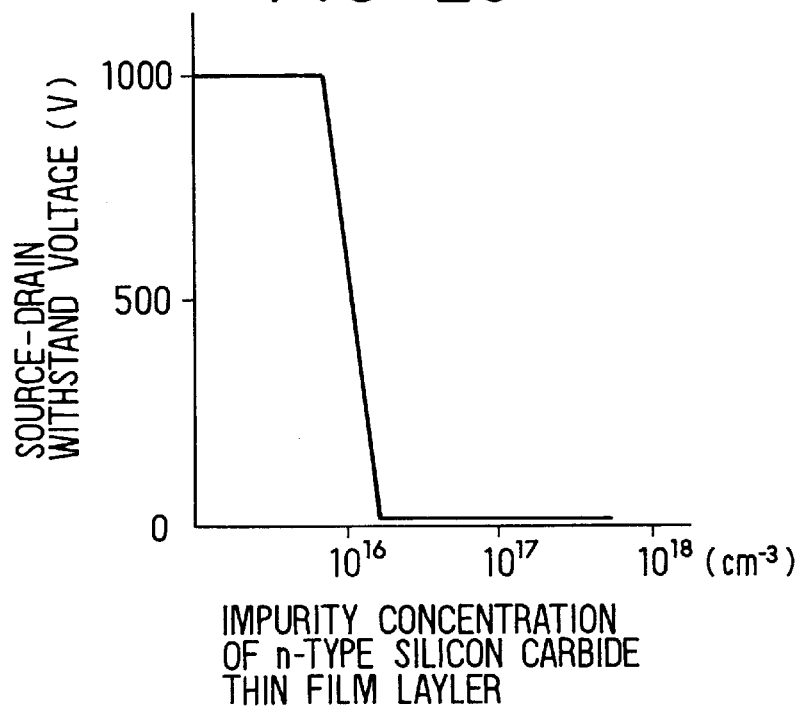
FIG. 20 is a view showing impurity concentration dependency of the source-drain withstand voltage for a case wherein a thin film semiconductor layer was added to a trench gate type power MOSFET of source-drain withstand voltage 1000V.

Specifically, a study was carried out from a simulation showing the relationship between the impurity concentration of the thin film semiconductor layer 8 and the source-drain withstand voltage. In FIG. 20, an example of the impurity concentration dependency of the source-drain withstand voltage predicted from the simulation for a case wherein a thin film semiconductor layer of a fixed film thickness of 250 nm was formed in a trench gate type power MOSFET whose source-drain withstand voltage obtained with an n$^-$-type epitaxial layer 2 and a p-type epitaxial layer 3 is 1000V is shown. In this case, the gate electrode layer 10 was formed using n-type polysilicon.

As shown in FIG. 20, at impurity concentrations of the thin film semiconductor layer below $7 \times 10^{15}$ cm$^{-3}$ the 1000V that is the withstand voltage of when the thin film semiconductor layer is not formed is maintained, but if the impurity concentration increases even slightly from $7 \times 10^{15}$ cm$^{-3}$ the withstand voltage decreases rapidly. When the impurity concentration exceeds $2 \times 10^{16}$ cm$^{-3}$, the withstand voltage becomes 0V. Therefore, if the impurity concentration of the thin film semiconductor layer is below $7 \times 10^{15}$ cm$^{-3}$ it is possible to maintain the withstand voltage at the design withstand voltage of 1000V, and even if for some reason there is a measure of dispersion in the impurity concentration, dispersion does not arise in the withstand voltage. When on the other hand the center value of the impurity concentration of the thin film semiconductor layer is around $1 \times 10^{16}$, if for some reason the impurity concentration varies then the withstand voltage will vary over a wide range. This range of variation in the withstand voltage is determined by the range of the variation in the impurity concentration.

When the surface orientation of the thin film semiconductor layer is made substantially {11$\bar{2}$0}, the source-drain withstand voltage can be maintained well at the design withstand voltage. Therefore, it can be supposed that the center value of the impurity concentration of the thin film semiconductor layer is in a concentration region low enough for the design withstand voltage to be maintained. When the surface orientation of the thin film semiconductor layer is made substantially {1$\bar{1}$00}, the center value of the impurity concentration of the thin film semiconductor layer is a higher concentration than when the channel face is made a substantially {11$\bar{2}$0} face, and can be supposed to be right in a withstand voltage transition region.

From these results it is clear that if the surface orientation of the thin film semiconductor layer 8 is set to substantially {11$\bar{2}$0} it is possible to maintain a design source-drain withstand voltage well.

In the preferred embodiment described above, the source electrode layer 12 formed on the n$^+$-type source region 5 and the low-resistance p-type silicon carbide region 6 may respectively be made of different materials from the materials described above. Also, it is possible to dispense with the low-resistance p-type silicon carbide region 6, in which case the source electrode layer 12 is formed in contact with the n$^+$-type source region 5 and the p-type epitaxial layer 3. It is sufficient if the source electrode layer 12 may be formed at least on the surface of the n$^+$-type source region 5.

A silicon carbide semiconductor device according to the invention is not limited to the n-channel vertical type MOSFET described above and can also be similarly applied to a p-channel vertical type MOSFET obtained by switching the p-types and the n-types in FIG. 1.

Figure 10:
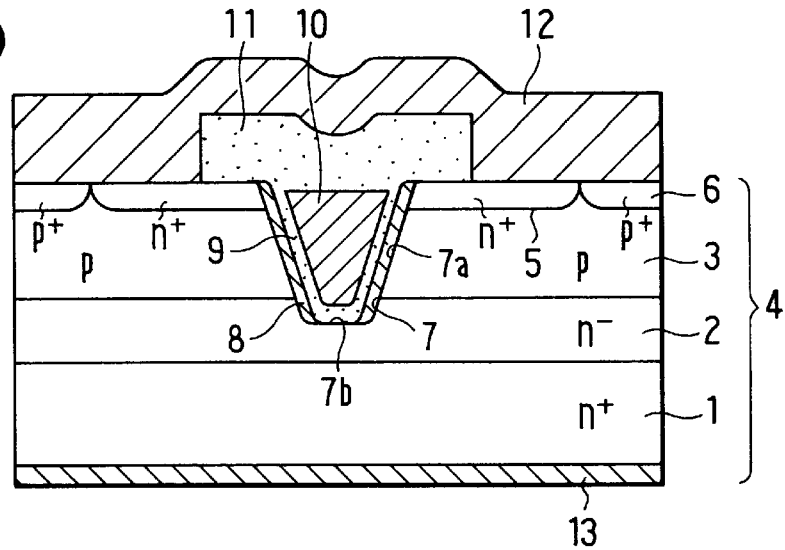
FIG. 10 is a sectional schematic view showing the construction of a modified version of the trench gate type power MOSFET shown in FIG. 1.
Figure 11:
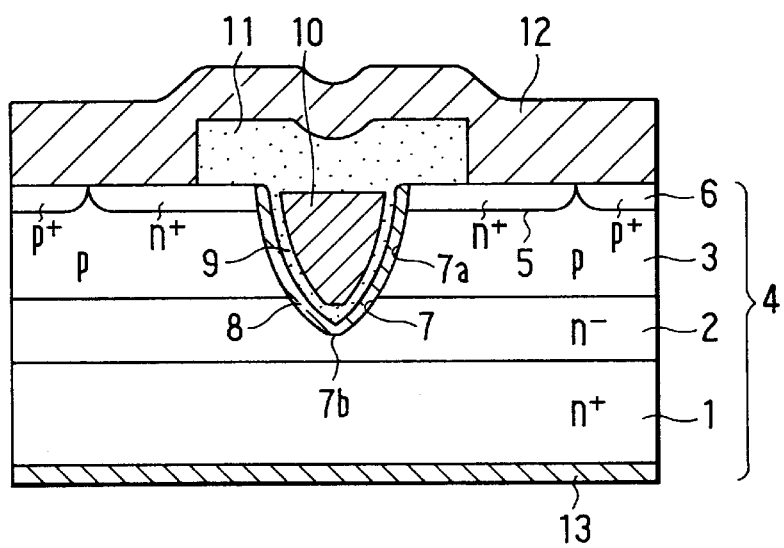
FIG. 11 is a sectional schematic view showing the construction of a modified version of the trench gate type power MOSFET shown in FIG. 1.

Also, although in the construction shown in FIG. 1 the side face 7a of the trench 7 is at approximately 90° to the surface of the semiconductor substrate 4, as shown in FIG. 10 the angle formed by the side face 7a of the trench 7 and the surface of the semiconductor substrate 4 does not necessarily have to be close to 90°. Also, the trench 7 may be a V-shape not having a bottom face. And as shown in FIG. 11 the side face 7a of the trench 7 does not have to be flat and may alternatively be a smooth curved surface.

It is to be noted that a superior effect can be obtained by designing the angle formed by the side face 7a of the trench 7 and the semiconductor substrate 4 so that the channel mobility increases.

Figure 12:
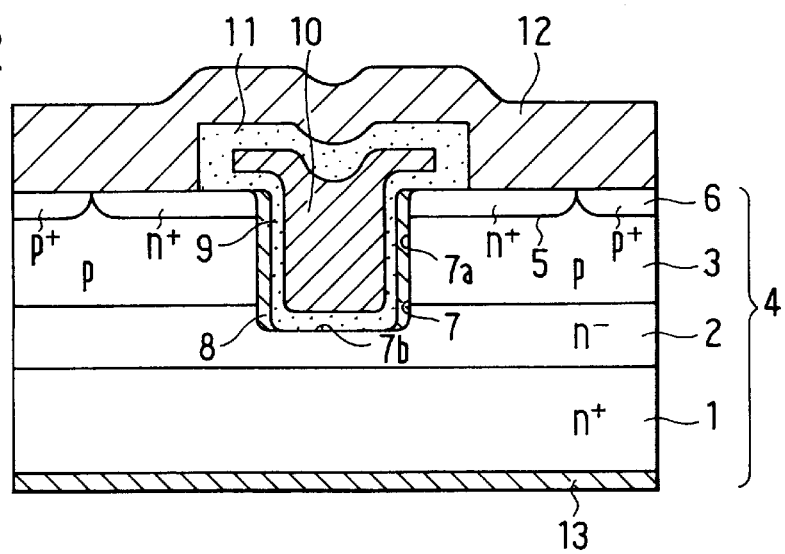
FIG. 12 is a sectional schematic view showing the construction of a modified version of the trench gate type power MOSFET shown in FIG. 1.

Also, as shown in FIG. 12, the upper part of the gate electrode layer 10 may be of such a shape that it extends above the n⁺-type source region 5. By adopting this construction, it is possible to reduce the connection resistance between the n⁺-type source region 5 and the channel induced in the n-type thin film semiconductor layer 8.

Figure 13:
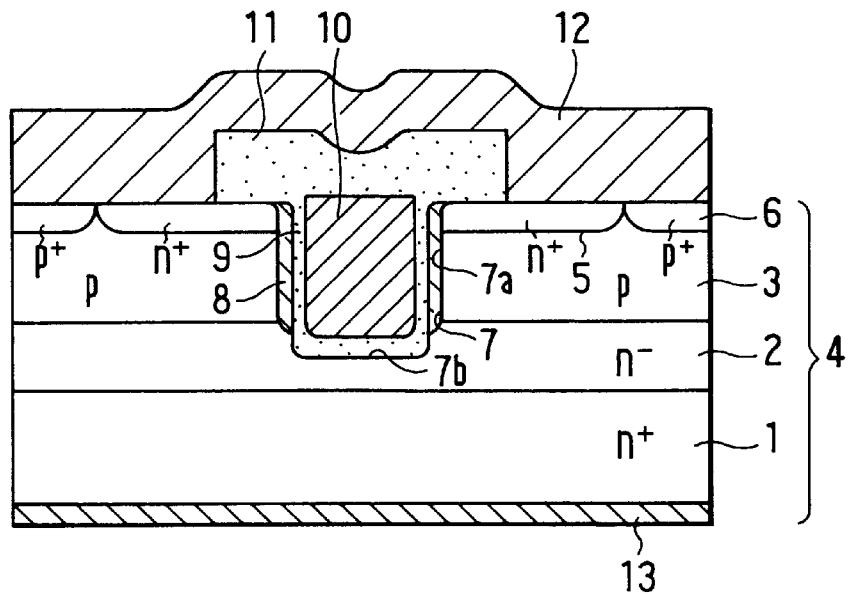
FIG. 13 is a sectional schematic view showing the construction of a modified version of the trench gate type power MOSFET shown in FIG. 1.
Figure 14:
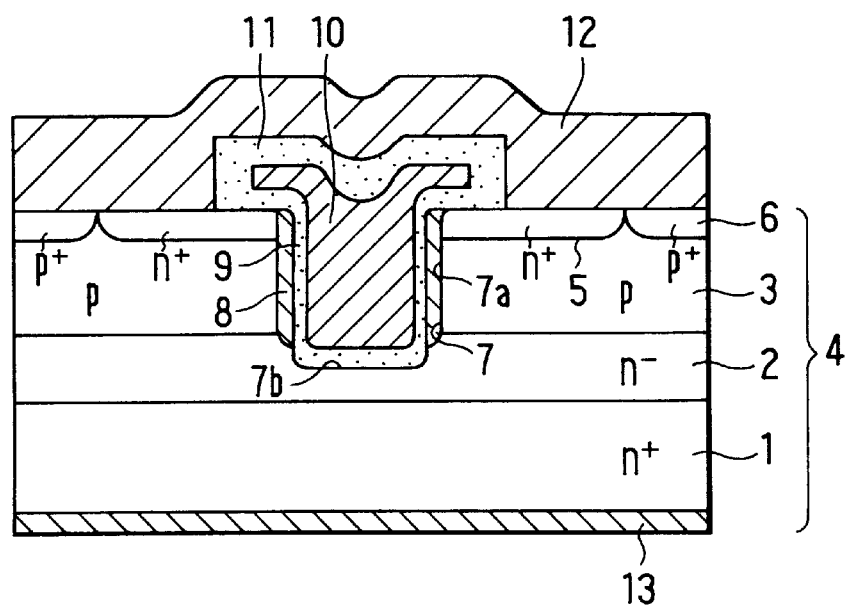
FIG. 14 is a sectional schematic view showing the construction of a modified version of the trench gate type power MOSFET shown in FIG. 1.

Also, as shown in FIG. 13, a structure may be employed wherein the thickness of the gate oxide film 9 is substantially the same at the lower end of the n-type thin film semiconductor layer 8 in which the channel is formed as it is at the middle thereof and the gate electrode layer 10 extends to below the lower end of the n-type thin film semiconductor layer 8. By adopting this construction it is possible to reduce the connection resistance between the channel induced in the n-type thin film semiconductor layer 8 and the drain region. Or the construction shown in FIG. 14 may be used. That is, a construction wherein the upper part of the gate electrode layer 10 is of such a shape that it extends above the n⁺-type source region 5 as shown in FIG. 12 and also the gate electrode layer 10 extends to below the lower end of the n-type thin film semiconductor layer 8 as shown in FIG. 13 may be adopted.

The n-type thin film semiconductor layer 8 and the p-type epitaxial layer 3 may be of different crystal types, and for example by making the p-type epitaxial layer 3 6H-SiC and 20 making the n-type thin film semiconductor layer 8 4H-SiC and thereby increasing mobility in the direction in which the carriers flow it is possible to obtain a MOSFET having lower power loss.

Figure 15:
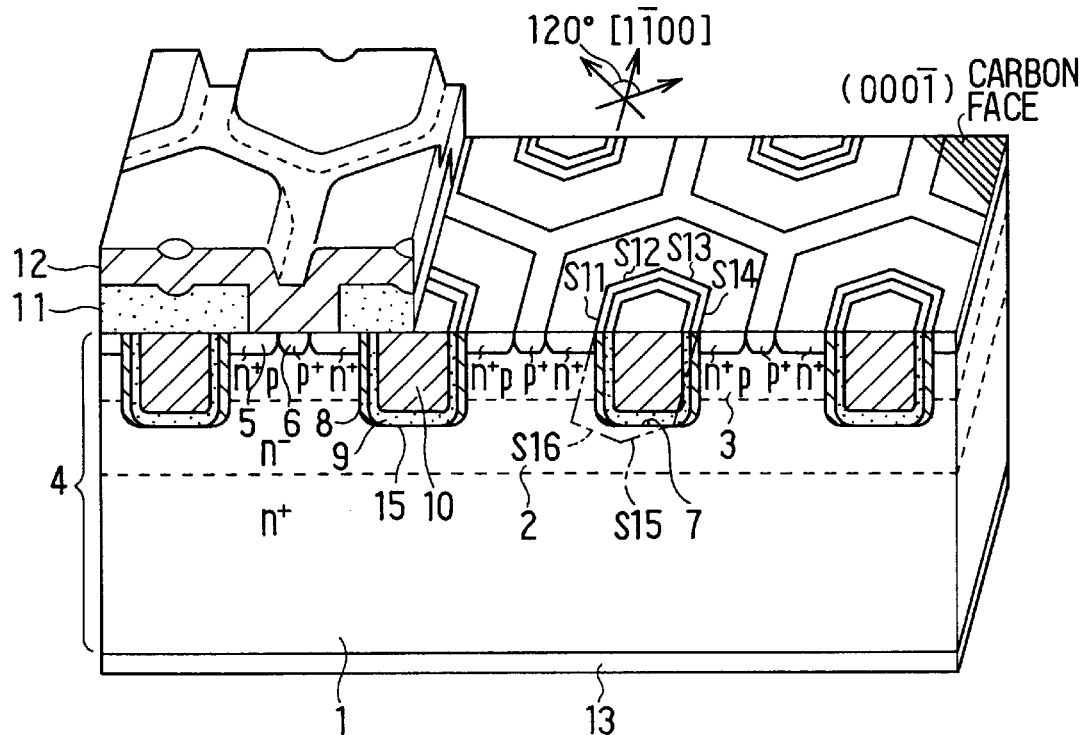
FIG. 15 is a perspective view of a modified version of the trench gate type power MOSFET shown in FIG. 1.
Figure 16:
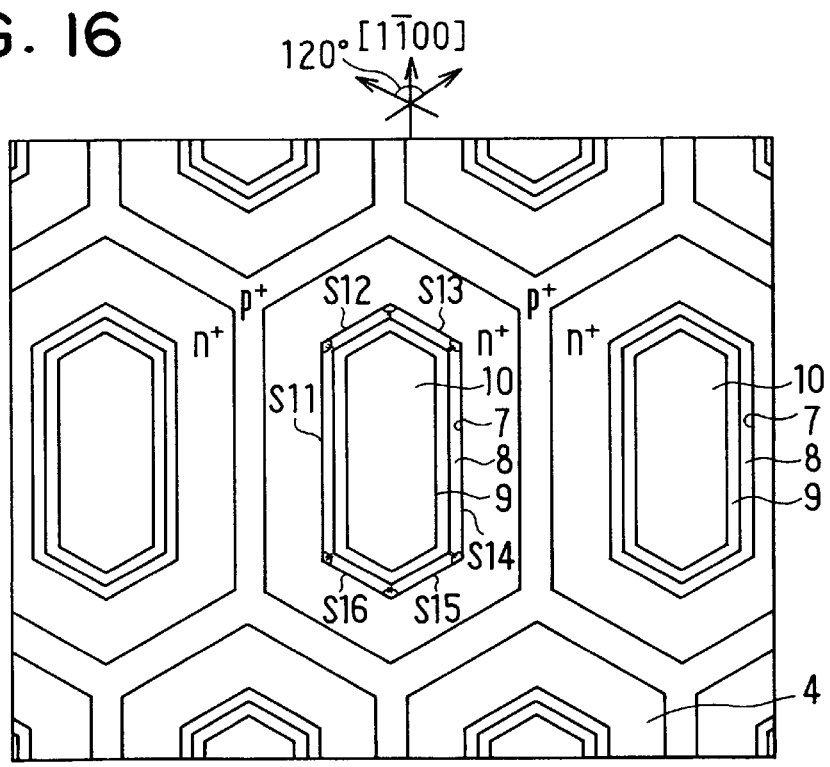
FIG. 16 is a plan view of a semiconductor substrate 4 shown in FIG. 15.
Figure 17:
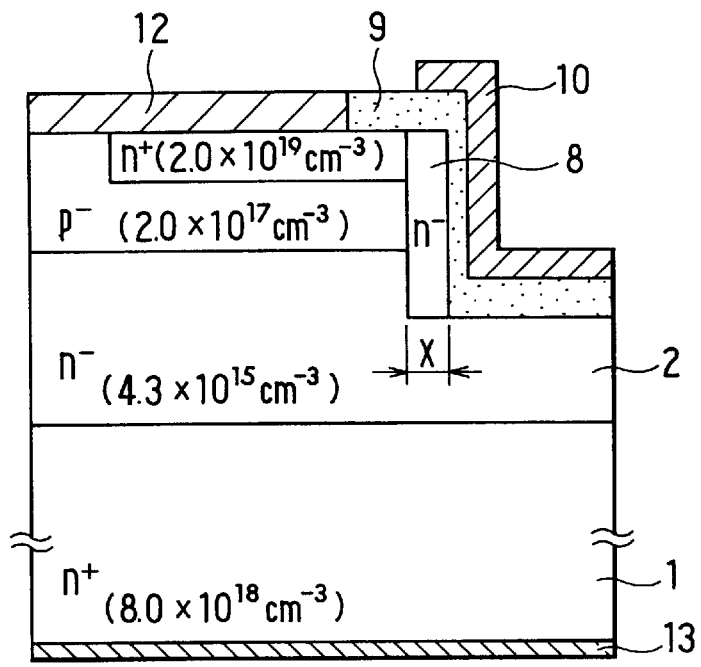
FIG. 17 is a view showing a simulation model for determining the film thickness and the impurity concentration of an n-type thin film semiconductor layer 8.

Also, as shown in FIG. 15, the plan shape of the side face of the trench 7 on the gate electrode layer 10 side may be made a hexagon with substantially equal internal angles. In other words, as shown in the plan view of the semiconductor substrate 4 of FIG. 16, the gate electrode side shape may be made a hexagon of whose six sides S11, S12, S13, S14, S15, S16 the angle (internal) made by the sides S11 and S12, the angle (internal) made by the sides S12 and S13, the angle (internal) made by the sides S13 and S14, the angle (internal) made by the sides S14 and S15, the angle (internal) made by the sides S15 and S16 and the angle (internal) made by the sides S16 and S11 are approximately 120°.

Also, the side face 7a of the trench 7 does not have to be made up of a plurality of faces parallel with the approximate [1$\bar{1}$00] direction, and alternatively may be made up of a plurality of faces parallel with the approximate [11$\bar{2}$0] direction.

Figure 21:
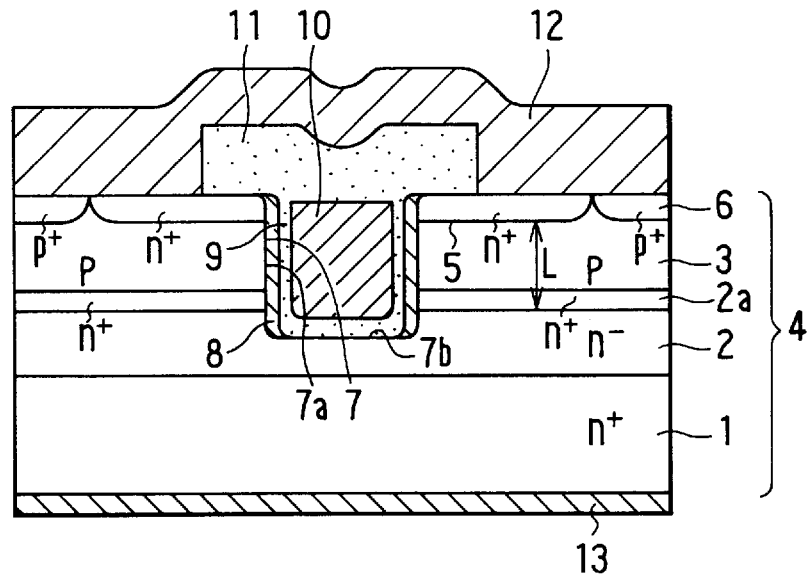
FIG. 21 is a sectional view of a trench gate type power MOSFET according to a second preferred embodiment of the invention.

A second preferred embodiment of the invention will now be described. FIG. 21 shows an n-channel type trench gate power MOSFET (vertical type power MOSFET) of this preferred embodiment.

An n⁺-type silicon carbide semiconductor substrate 1 serving as a first low-resistance semiconductor layer is formed using hexagonal silicon carbide. On this n⁺-type silicon carbide semiconductor substrate 1 are successively layered an n⁻-type silicon carbide semiconductor layer (n⁻-type epitaxial layer) 2 constituting a high-resistance semiconductor layer, an n⁺-type silicon carbide semiconductor layer (n⁺-type epitaxial layer) 2a constituting a second low-resistance semiconductor layer, and a p-type silicon carbide semiconductor layer (p-type epitaxial layer) 3 constituting a first semiconductor layer. In this way, a semiconductor substrate 4 consisting of monocrystalline silicon carbide is made up of the n⁺-type silicon carbide semiconductor substrate 1, the n⁻-type epitaxial layer 2, the n⁺-type epitaxial layer 2a and the p-type epitaxial layer 3, and the upper face of this semiconductor substrate 4 is a substantially (000$\bar{1}$) carbon face.

An n⁺-type source region 5 constituting a semiconductor region is formed in a predetermined region of the surface of the p-type epitaxial layer 3. Also, a lowresistance p-type silicon carbide region 6 is formed in the surface of the p-type epitaxial layer 3 in a predetermined region surrounded by the n⁺-type source region 5.

A trench 7 is formed in a predetermined region of the n⁺-type source region 5. This trench 7 passes through the n⁺-type source region 5, the p-type epitaxial layer 3 and the n⁺-type epitaxial layer 2a and reaches the n⁻-type epitaxial layer 2. The trench 7 has a side face 7a perpendicular to the surface of the semiconductor substrate 4 and a bottom face 7b parallel with the surface of the semiconductor substrate 4.

An n-type thin film semiconductor layer (second semiconductor layer) 8 of silicon carbide extends in the approximate [1$\bar{1}$00] direction or the approximate [11$\bar{2}$0] direction over the surfaces of the n⁺-type source region 5, the p-type epitaxial layer 3, the n⁺-type epitaxial layer 2a and the n⁻-type epitaxial layer 2 at the side face 7a of the trench 7. The n-type thin film semiconductor layer 8 consists of a thin film of thickness approximately 1000 to 5000 Å. The crystal type of the n-type thin film semiconductor layer 8 is the same as the crystal type of the p-type epitaxial layer 3, and is for example 6H-SiC. Instead of this it may alternatively be 4H-SiC or 3C-SiC. The impurity concentration of the n-type thin film semiconductor layer 8 is lower than the impurity concentrations of the n⁺-type silicon carbide semiconductor substrate 1, the n⁺-type epitaxial layer 2a and the n⁺-type source region 5.

A gate oxide film 9 is formed on the surface of the n-type thin film semiconductor layer 8 and the bottom face 7b of the trench 7. The inside of the gate oxide film 9 in the trench 7 is filled with a gate electrode layer 10. The gate electrode layer 10 is covered by an interlayer insulating film 11. A source electrode layer 12 constituting a first electrode layer is formed on the surface of the n⁺-type source region 5 and the surface of the low-resistance p-type silicon carbide region 6. A drain electrode layer 13 constituting a second electrode layer is formed on the surface of the n⁺-type silicon carbide semiconductor substrate 1 (the rear side of the semiconductor substrate 4).

Thus this second preferred embodiment differs from the first preferred embodiment in the point that an n⁺-type epitaxial layer 2a is formed between the n⁻-type epitaxial layer 2 and the p-type epitaxial layer 3.

The basic operation of the trench gate type power MOSFET of the second preferred embodiment is the same as that of the first preferred embodiment. Here, the effect of the provision of the n⁺-type epitaxial layer 2a will be described.

First, since the p-type epitaxial layer 3 (body layer) and the n⁺-type epitaxial layer 2a form a pn junction, 5 the device can be designed so that its withstand voltage is determined by avalanche breakdown of the pn junction between the p-type epitaxial layer 3 and the n⁺-type epitaxial layer 2a, and therefore the resistance to destruction of the device can be made high.

Also, by controlling the impurity concentrations of the p-type epitaxial layer 3, the n⁺-type epitaxial layer 2a and the n-type thin film semiconductor layer 8 independently it is possible to make a MOSFET with a high withstand voltage, low power loss and a low gate threshold voltage. In particular, if the impurity concentration of the n-type thin film semiconductor layer 8 in which the channel is formed is reduced the influence of impurity scattering in carrier flow decreases and it is possible to increase the channel mobility.

The source-drain withstand voltage is mainly governed by the impurity concentrations and the film thicknesses of the n⁻-type epitaxial layer 2, the n⁺-type epitaxial layer 2a and the p-type epitaxial layer 3. Therefore, by raising the impurity concentration of the p-type epitaxial layer 3 it is possible to shorten the distance L sandwiched between the high-resistance semiconductor layer 2 and the source semiconductor region 5. Therefore, it is possible to make the channel length short while maintaining a high withstand voltage. Consequently, the channel resistance can be greatly reduced and it is possible to lower the source-drain on-resistance.

Also, by interposing the n⁺-type epitaxial layer 2a between the p-type epitaxial layer 3 and the n⁻-type epitaxial layer 2, it becomes possible to prevent destruction of the gate oxide film 9 due to avalanche breakdown at the bottom of the trench 7 (hereinafter simply referred to as the trench bottom).

Figure 22:
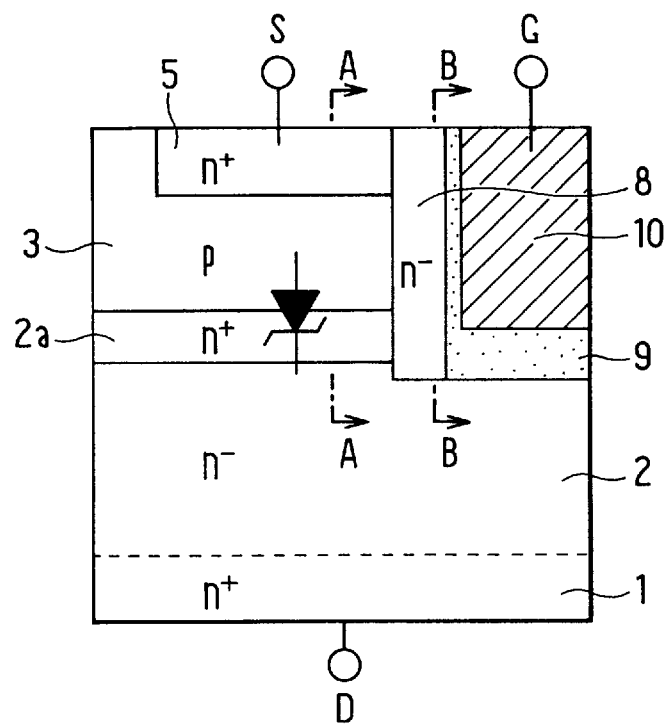
FIG. 22 is a schematic sectional view illustrating the operation of the trench gate type power MOSFET shown in FIG. 21.

In FIG. 22, a pn⁺n⁻ diode (a body diode) is formed by the p-type epitaxial layer 3, the n⁺-type epitaxial layer 2a and the n⁻-type epitaxial layer 2 at the section A—A. In this pn⁺n⁻ body diode, because the n⁺-type epitaxial layer 2a is present below the p-type epitaxial layer (body layer) 3, when a reverse voltage (a voltage such that the pn junction between the drain and the source is reversely biased) is impressed across the drain-source, the extension of a depletion layer extending from the p-type epitaxial layer 3 toward the n⁺-type epitaxial layer 2a and the n⁻-type epitaxial layer 2 is suppressed. As a result, because the electric field strength due to this depletion layer becomes larger than the electric field strength at the trench bottom, the withstand voltage of the pn⁺n⁻ diode becomes low. This withstand voltage can be lowered by either increasing the impurity concentration of the n⁺-type epitaxial layer 2a or increasing the thickness of the n⁺-type epitaxial layer 2a.

The trench bottom at the section B—B, on the other hand, is isolated from the n⁺-type epitaxial layer 2a by the n-type thin film semiconductor layer 8. Consequently, even though the n⁺-type epitaxial layer 2a is formed between the p-type epitaxial layer 3 and the n⁻-type epitaxial layer 2, the withstand voltage at the trench bottom does not fall.

Therefore, by adjusting the impurity concentration and the thickness of the n⁺-type epitaxial layer 2a it is possible to lower the withstand voltage of the body diode to below the withstand voltage of the trench bottom. As a result, because the body diode then undergoes avalanche breakdown before the trench bottom undergoes avalanche breakdown, destruction of the gate oxide film 9 can be prevented.

Since the n-type thin film semiconductor layer 8 is formed beside the n⁺-type epitaxial layer 2a, the electric field strength of the body diode part is moderated by the n-type thin film semiconductor layer 8 and does not directly affect the trench bottom.

Because the impurity concentration of the n-type thin film semiconductor layer 8 is lower than that of the n⁺-type epitaxial layer 2a, at the section B—B the extension of the depletion layer at the part of the trench bottom in the n-type thin film semiconductor layer 8 can be made larger than that at the n⁺-type epitaxial layer 2a of the section A—A. As a result, the maximum electric field strength at the section B—B can be made lower than the section A—A.

Also, because the n⁺-type epitaxial layer 2a is formed below the p-type epitaxial layer 3, electrons flowing out of the n-type thin film semiconductor layer 8 beside the p-type epitaxial layer 3 toward the drain electrode 13 also flow and spread in the horizontal direction, that is, carriers also flow immediately below the p-type epitaxial layer 3, and therefore, the resistance of the n⁻-type epitaxial layer 2 can be made small.

The impurity concentration of the n⁺-type epitaxial layer 2a is preferably made at least one order higher than the impurity concentration of the n⁻-type epitaxial layer 2. If the n⁺-type epitaxial layer 2a is given such a concentration, it is possible to make the thickness of the n⁺-type epitaxial layer 2a under 0.3 μm.

Next, a process for manufacturing a trench gate type power MOSFET according to the second preferred embodiment will be described using FIGS. 23 through 29.

Figure 23:
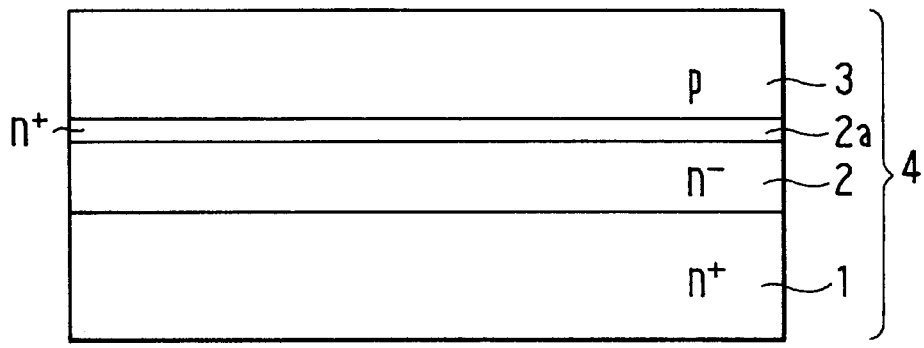
FIGS. 23 through 29 are sectional views illustrating a process for manufacturing the trench gate type power MOSFET shown in FIG. 21.

First, as shown in FIG. 23, an n⁺-type silicon carbide semiconductor substrate 1 whose principal surface is a (000$\bar{1}$) carbon face is prepared, and on the surface of that an n⁻-type epitaxial layer 2 is epitaxially grown. On the n⁻-type epitaxial layer 2 an n⁺-type epitaxial layer 2a is epitaxially grown, and on that a p-type epitaxial layer 3 is epitaxially grown. In this way, a semiconductor substrate 4 made up of the n⁺-type silicon carbide semiconductor substrate 1, the n⁻-type epitaxial layer 2, the n⁺-type epitaxial layer 2a and the p-type epitaxial layer 3 is formed. The n⁻-type epitaxial layer 2, the n⁺-type epitaxial layer 2a and the p-type epitaxial layer 3 are formed with the crystal axis of the n⁺-type silicon carbide semiconductor substrate 1 inclined about 3.5° to 8°, and consequently the principal surface of the semiconductor substrate 4 is an approximate (000$\bar{1}$) carbon face.

Figure 24:
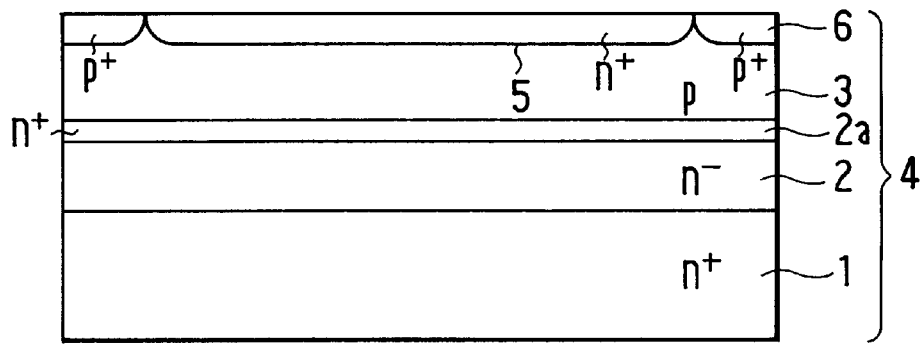

Next, as shown in FIG. 24, an n⁺-type source region 5 is formed in a predetermined region of the surface of the p-type epitaxial layer 3 for example by ion implantation of nitrogen. Also, a low-resistance p-type silicon carbide region 6 is formed in another predetermined region of the surface of the p-type epitaxial layer 3 for example by ion implantation of aluminum.

Figure 25:
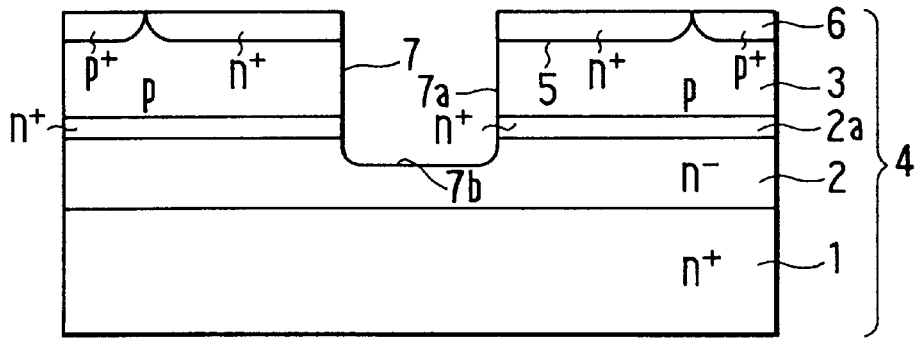

Then, as shown in FIG. 25, by RIE (Reactive Ion Etching), a trench 7 passing through the n⁺-type source region 5, the p-type epitaxial layer 3 and the n⁺-type epitaxial layer 2a and reaching the n⁻-type epitaxial layer 2 is formed. At this time, the trench 7 is so formed that the side face 7a of the trench 7 is parallel with the approximate [1$\bar{1}$00] direction or the approximate [11$\bar{2}$0] direction.

Figure 26:
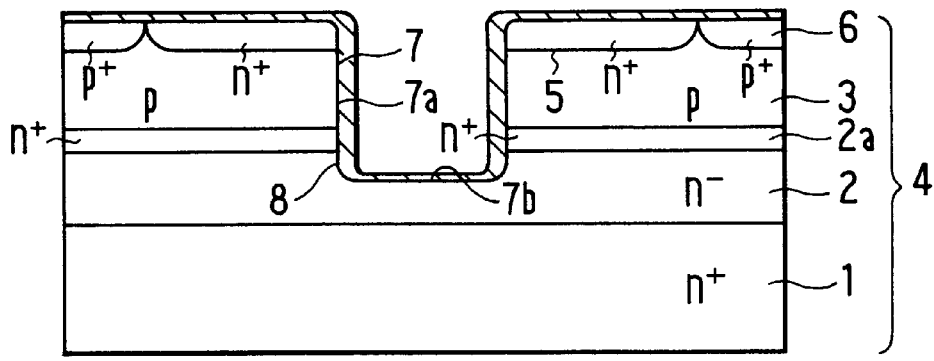

Also, as shown in FIG. 26, an n-type thin film semiconductor layer 8 is formed by epitaxial growth on the upper face of the semiconductor substrate 4 including the inner walls (the side face 7a and the bottom face 7b) of the trench 7. Specifically, by CVD, a thin film layer of 6H-SiC is formed on 6H-SiC by homo-epitaxial growth to form an n-type thin film semiconductor layer 8 extending over the surfaces of the n⁺-type source region 5, the p-type epitaxial layer 3, the n⁺-type epitaxial layer 2a and the n⁻-type epitaxial layer 2 at the inner walls of the trench 7.

At this time, because compared to the rate of growth on the (000$\bar{1}$) carbon face the epitaxial growth rate in a direction perpendicular thereto is 8 to 10 times or more faster, the n-type thin film semiconductor layer 8 can be formed thickly on the side face 7a and thinly on the bottom face 7b. It is to be noted that the impurity concentration of the n-type thin film semiconductor layer 8 on the side face 7a is set lower than the impurity concentrations of the n⁺-type silicon carbide semiconductor substrate 1, the n⁺-type epitaxial layer 2a and the n⁺-type source region 5.

Figure 27:
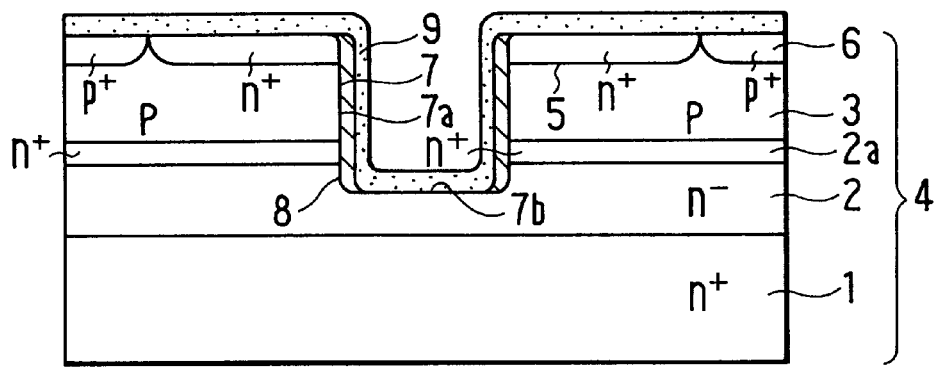

Then, as shown in FIG. 27, by thermal oxidation a gate oxide film (thermal oxide film) 9 is formed on the surfaces of the semiconductor substrate 4 and the n-type thin film semiconductor layer 8 and on the bottom face 7b of the trench 7. At this time, the thermal oxide film is thin on the side face 7a and is thick on the substrate surface and on the trench bottom face 7b, and the n-type thin film semiconductor layer 8 formed by epitaxial growth on the semiconductor substrate 4 surface and on the trench bottom face 7b becomes oxide film. In this way, the epitaxially grown n-type thin film semiconductor layer 8 on the semiconductor substrate 4 surface and on the trench bottom face 7b is oxidized and the n-type thin film semiconductor layer 8 only remains on the trench side face 7a.

Figure 28:
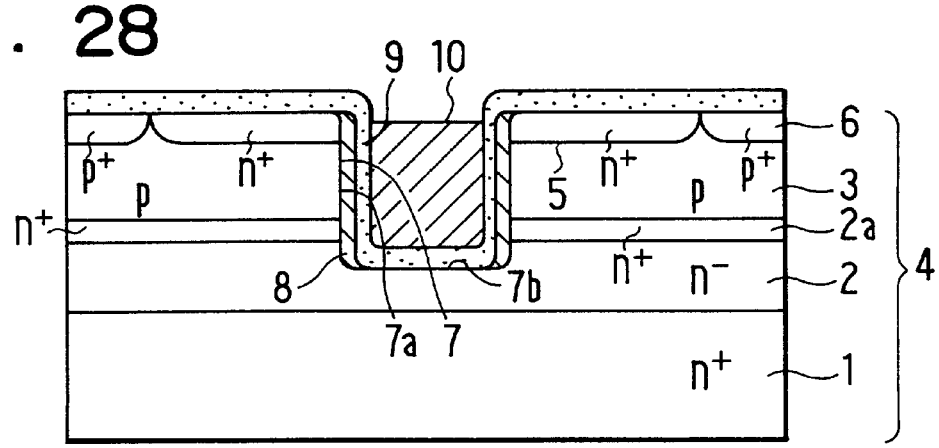
Figure 29:
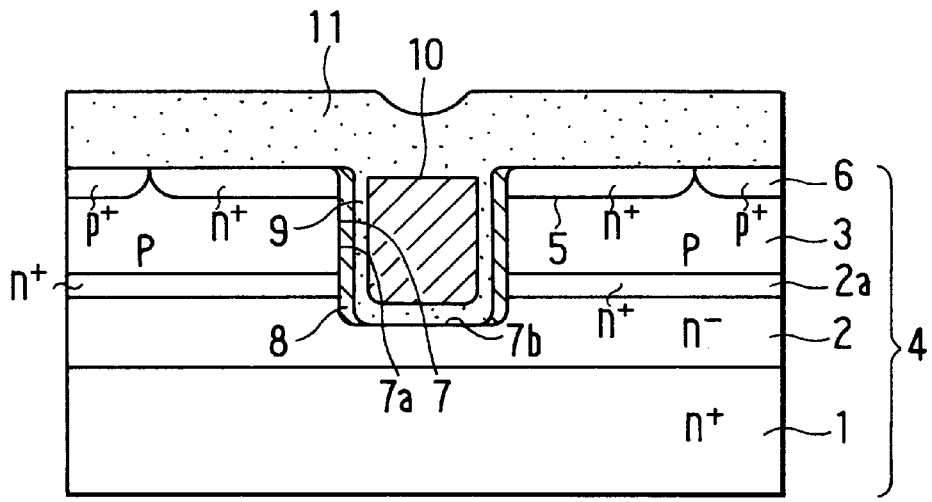

Then, as shown in FIG. 28, the inside of the gate oxide film 9 in the trench 7 is filled with a gate electrode layer 10. Also, as shown in FIG. 29, an interlayer insulating film 11 is formed on the upper surface of the gate electrode layer 10. After that, as shown in FIG. 21, a source electrode layer 12 is formed on the n+-type source region 5, the interlayer insulating film 11 and the low-resistance p-type silicon carbide region 6. Also, a drain electrode layer 13 is formed on the surface of the n+-type silicon carbide semiconductor substrate 1, and the trench gate type power MOSFET is thereby completed.

Thus in this preferred embodiment, because the n-type thin film semiconductor layer 8 is disposed on the side face 7a of the trench 7 and the gate electrode layer 10 is provided above this n-type thin film semiconductor layer 8, the impurity concentration of the n-type thin film semiconductor layer 8 constituting the channel-forming region can be adjusted independently of the p-type epitaxial layer 3 and the n+-type epitaxial layer 2a, and therefore a high withstand voltage, low power loss and a low gate threshold voltage can be obtained. Also, by making the impurity concentration of the n-type thin film semiconductor layer 8 forming the channel low and making its thickness thin at about 1000 to 5000 Å, even under high-temperature conditions the source-drain leak current can be made small.

In the preferred embodiment described above, the source electrode layer 12 formed on the n+-type source region 5 and the low-resistance p-type silicon carbide region 6 may be made of a different material. Also, it is possible to dispense with the low-resistance p-type silicon carbide region 6, in which case the source electrode layer 12 is formed in contact with the n+-type source region 5 and the p-type epitaxial layer 3. It is sufficient if the source electrode layer 12 is formed at least on the surface of the n+-type source region 5.

Figure 30:
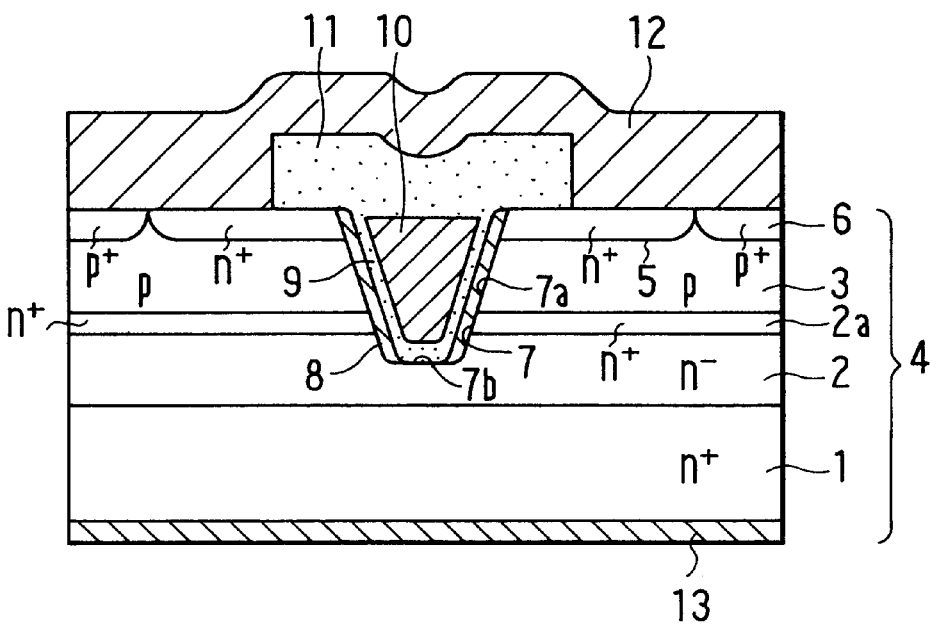
FIG. 30 is a sectional view showing a modified version of the trench gate type power MOSFET shown in FIG. 21.
Figure 31:
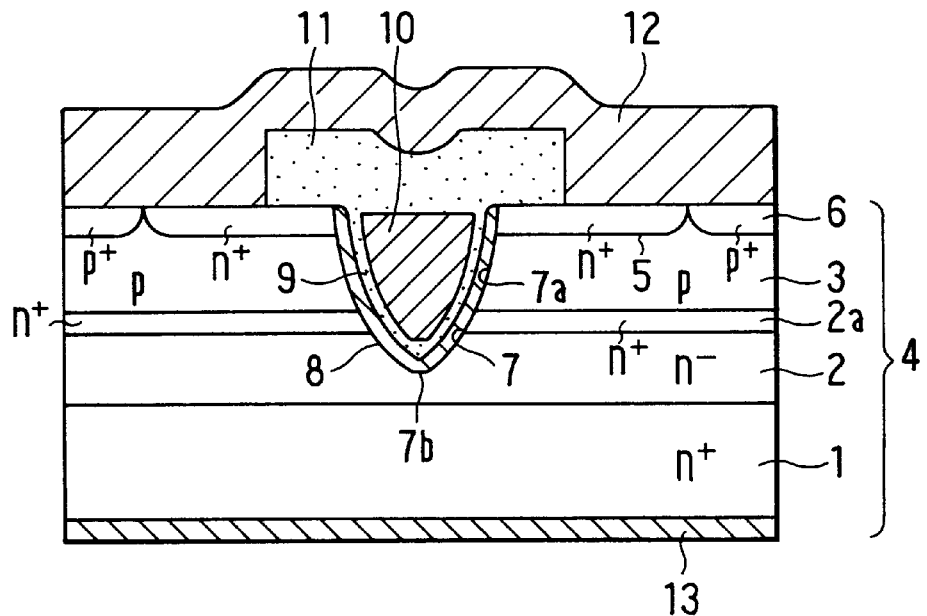
FIG. 31 is a sectional view showing a modified version of the trench gate type power MOSFET shown in FIG. 21.

Although in the construction shown in FIG. 21 the side face 7a of the trench 7 is at approximately 90° to the surface of the semiconductor substrate 4, as shown in FIG. 30 the angle formed by the side face 7a of the trench 7 and the surface of the semiconductor substrate 4 does not necessarily have to be close to 90°. Also, the trench 7 may be a V-shape not having a bottom face. And as shown in FIG. 31 the side face 7a of the trench 7 does not have to be flat and may alternatively be a smooth curved surface. A superior effect can be obtained by designing the angle formed by the side face 7a of the trench 7 and the semiconductor substrate 4 so that the channel mobility becomes large.

Figure 32:
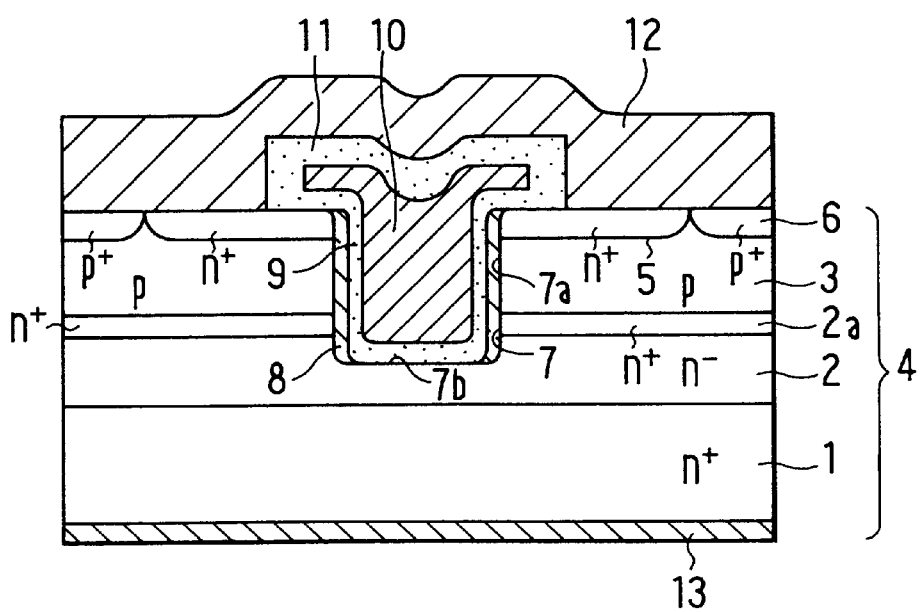
FIG. 32 is a sectional view showing a modified version of the trench gate type power MOSFET shown in FIG. 21.

As shown in FIG. 32, the upper part of the gate electrode layer 10 may be of such a shape that it extends above the n+-type source region 5. By adopting this construction, it is possible to reduce the connection resistance between the n+-type source region 5 and the channel induced in the n-type thin film semiconductor layer 8.

Figure 33:
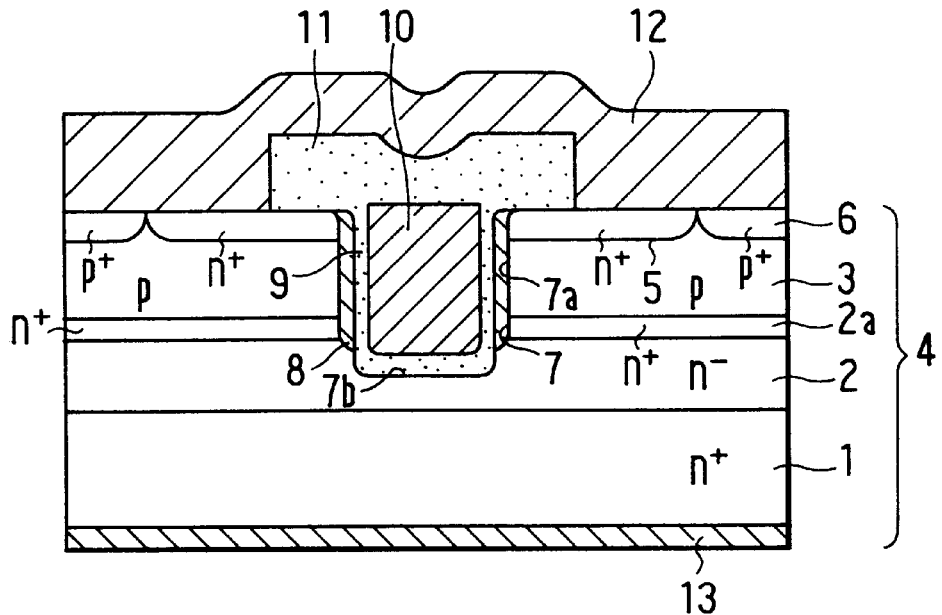
FIG. 33 is a sectional view showing a modified version of the trench gate type power MOSFET shown in FIG. 21.
Figure 34:
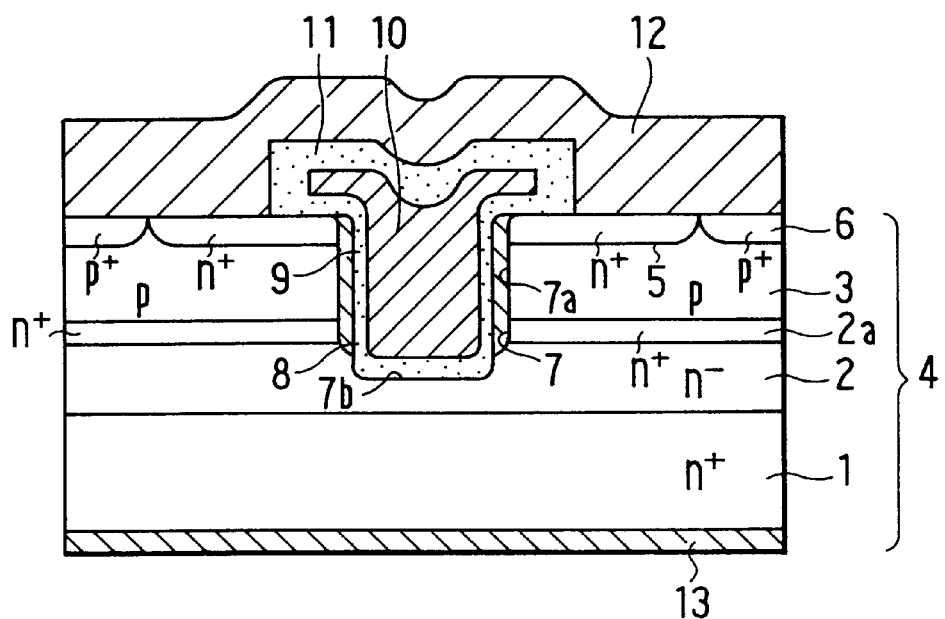
FIG. 34 is a sectional view showing a modified version of the trench gate type power MOSFET shown in FIG. 21.

Also, as shown in FIG. 33, a structure may be employed wherein the thickness of the gate oxide film 9 is substantially the same at the lower end of the n-type thin film semiconductor layer 8 in which the channel is formed as it is at the middle thereof and the gate electrode layer 10 extends to below the lower end of the n-type thin film semiconductor layer 8. By adopting this construction it is possible to reduce the connection resistance between the channel induced in the n-type thin film semiconductor layer 8 and the drain region. Or, the construction shown in FIG. 34 may be used. That is, a construction wherein the upper part of the gate electrode layer 10 is of such a shape that it extends above the n+-type source region 5 as shown in FIG. 32 and also the gate electrode layer 10 extends to below the lower end of the n-type thin film semiconductor layer 8 as shown in FIG. 33 may be adopted.

The n-type thin film semiconductor layer 8 and the p-type epitaxial layer 3 may be of different crystal types. For example, by making the p-type epitaxial layer 3 6H-SiC and making the n-type thin film semiconductor layer 8 4H-SiC and thereby increasing mobility in the direction in which carriers flow, it is possible to obtain a MOSFET having lower power loss.

Figure 35:
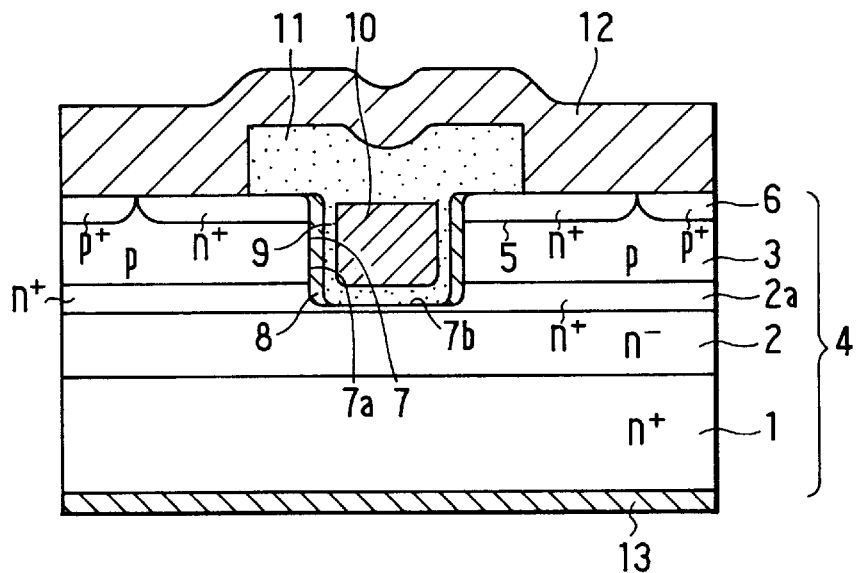
FIG. 35 is a sectional view showing a modified version of the trench gate type power MOSFET shown in FIG. 21.

Although in the preferred embodiment described above an example was shown wherein the trench 7 passes through the n+-type source region 5 and the p-type epitaxial layer 3 and the n+-type epitaxial layer 2a and reaches the n−-type epitaxial layer 2, alternatively, as shown in FIG. 35, the trench 7 may be formed reaching part-way through the n+-type epitaxial layer 2a without reaching the n−-type epitaxial layer 2. In this case, the thickness of the n+-type epitaxial layer 2a in contact with the bottom of the trench 7 is thinner than the thickness of the n+-type epitaxial layer 2a in contact with the p-type epitaxial layer 3. In this construction also, the electric field strength of the body diode part is moderated at the trench bottom by the n-type thin film semiconductor layer 8.

Next, a third preferred embodiment, in which destruction of the gate oxide film 9 at the trench bottom is prevented, will be described.

Figure 36:
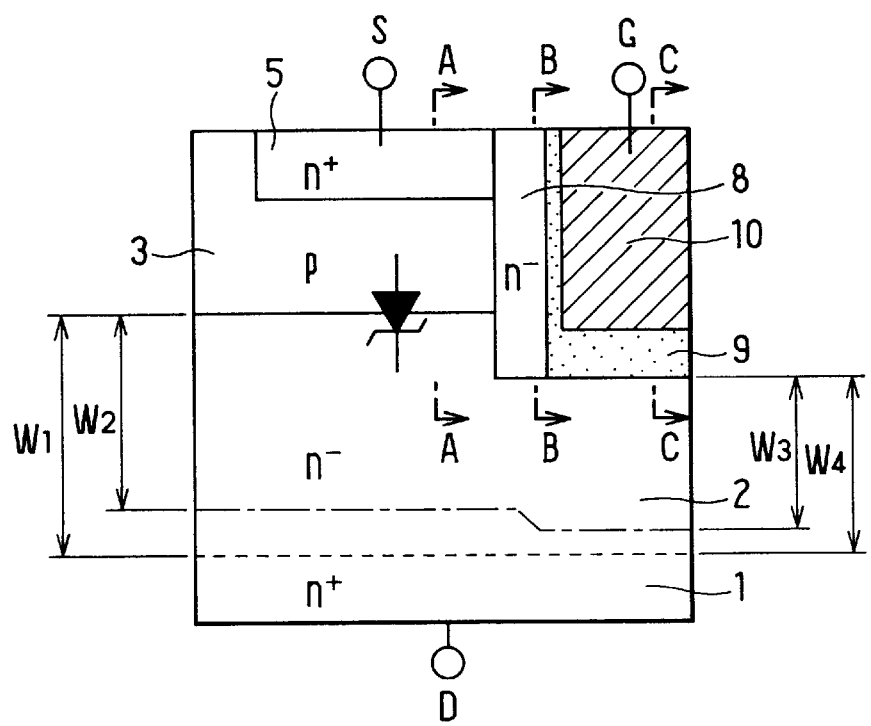
FIG. 36 is a schematic sectional view of a trench gate type power MOSFET according to a third preferred embodiment of the invention.

In the construction shown in FIG. 36, when a reverse biased voltage is impressed across the source-drain, at the section C—C, voltages act on both the gate oxide film 9 and the n−-type epitaxial layer 2. That is, the source-drain impressed voltage is divided by the gate oxide film 9 and the n−-type epitaxial layer 2. At the section A—A, on the other hand, since the impurity concentration of the p-type epitaxial layer 3 is set higher than the impurity concentration of the n−-type epitaxial layer 2, the depletion layer does not spread substantially to the p-type epitaxial layer 3 side and spreads to the n−-type epitaxial layer 2 side only. In this case, the source-drain impressed voltage forms a one-sided step junction acting only on the n−-type epitaxial layer 2.

Compared to when the depletion layer extends on the n−-type epitaxial layer 2 side with the impressed voltage being divided between the gate oxide film 9 and the n−-type epitaxial layer 2 as at the section C—C, the electric field strength at this kind of one-sided step junction is higher. The section B—B is a region mid-way between the section A—A and the section C—C and has an electric field strength value intermediate between those of the sections A—A and C—C.

Therefore, if the n−-type epitaxial layer 2 is made thick enough so that when the electric field strength due to the reverse bias voltage has reached the critical field strength at which avalanche breakdown occurs at the pn− diode (body diode) formed by the p-type epitaxial layer 3 and the n−-type epitaxial layer 2 the depletion layer extending from the gate oxide film 9 toward the n+-type silicon carbide semiconductor substrate 1 does not reach the n⁺-type silicon carbide semiconductor substrate 1, avalanche breakdown will occur at the pn⁻ diode first. Thus it is possible to prevent destruction of the gate oxide film 9 at the trench bottom.

In FIG. 36 the singly dashed line shows the depletion layer, and in this case the relationship between the depletion layer and the film thickness of the n⁻-type epitaxial layer 2 is set to $W_1 > W_2$, $W_3 < W_4$. Also, the thickness of the gate oxide film 9 and the impurity concentration of the p-type epitaxial layer 3 are set so that when the critical field strength is reached the voltage acting on the gate oxide film 9 at the trench bottom is greater than the voltage acting on the p-type epitaxial layer 3.

A fourth preferred embodiment, in which again destruction of the gate oxide film 9 at the trench bottom is prevented, will now be described.

Figure 37:
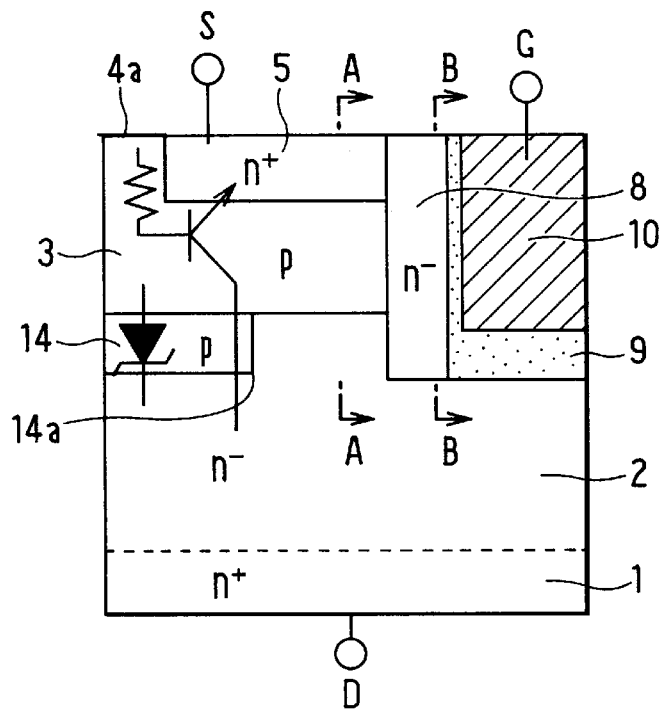
FIG. 37 is a schematic sectional view of a trench gate type power MOSFET according to a fourth preferred embodiment of the invention.

This preferred embodiment, as shown in FIG. 37, has a structure wherein a p-type embedded silicon carbide semiconductor layer (hereinafter simply referred to as a p-type embedded layer) 14 away from the trench 7 and in contact with the p-type epitaxial layer 3 is formed in the n⁻-type epitaxial layer 2.

With this construction, at the bottom of the junction between the p-type embedded layer 14 and the n⁻-type epitaxial layer 2, a corner 14a of a sharp curvature is formed between the n⁻-type epitaxial layer 2 and the p-type embedded layer 14. As a result, the electric field strength at the corner 14a is made higher than the maximum electric field strength at the section B—B and avalanche breakdown is made to occur in the pn⁻ diode (body diode) formed by the p-type embedded layer 14 and the n⁻-type epitaxial layer 2.

Therefore, because avalanche breakdown occurs at this pn⁻ diode first, destruction of the gate oxide film 9 is prevented.

By forming the p-type embedded layer 14 away from the trench 7, it is possible to limit the location at which avalanche breakdown occurs to below a part 4a where the p-type epitaxial layer 3 and the source electrode layer 12 are in contact. Because of this, it is possible to essentially reduce the base resistance of an n⁺pn⁻ parasitic bipolar transistor formed by the n⁺-type source region 5, the p-type epitaxial layer 3 and the n⁻-type epitaxial layer 2 and decrease "hfe" of the parasitic bipolar transistor. As a result, operation of the n⁺pn⁻ parasitic bipolar transistor is inhibited and avalanche capability can be increased.

In this preferred embodiment, because the embedded layer 14 is made p-type, if the p-type embedded layer 14 is formed deeper than the trench 7, a depletion layer extending from the p-type embedded layer 14 under a reverse bias can cover the trench bottom and can moderate the electric field strength of the trench bottom. As a result, it is possible to raise the reliability of the gate oxide film 9 still further.

Although in the preferred embodiment described above a case wherein the embedded layer 14 was made p-type was described, also when the embedded layer is made an n⁺-type embedded layer 14 it is possible to make the electric field strength of the corner 14a higher than the maximum electric field strength at the section B—B and make avalanche breakdown occur at the corner 14a. As a result, it is possible to obtain the same effects as those of the preferred embodiment described above.

A process for manufacturing the preferred embodiment shown in FIG. 37 will now be described.

Figure 38A:
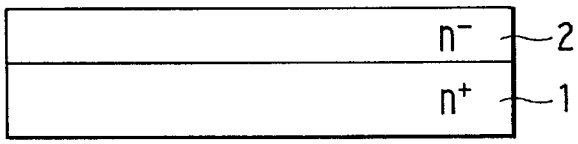
FIGS. 38A through 38C are sectional views illustrating a process for manufacturing the trench gate type power MOSFET shown in FIG. 37.

First, as shown in FIG. 38A, an n⁺-type silicon carbide semiconductor substrate 1 whose principal surface is a (000

Figure 38B:
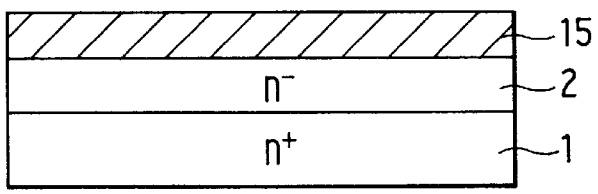

1) carbon face is prepared, and on the surface of that an n⁻-type epitaxial layer 2 is epitaxially grown. Then, as shown in FIG. 38B, an ion implantation mask 15, for example resist or an oxide film, is formed on the surface of the n⁻-type epitaxial layer 2.

Figure 38C:
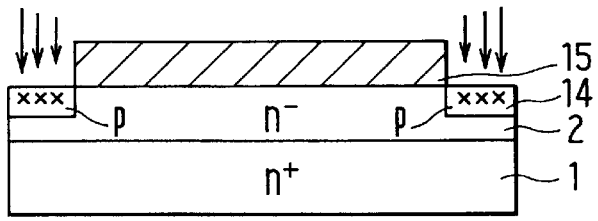
Figure 39:
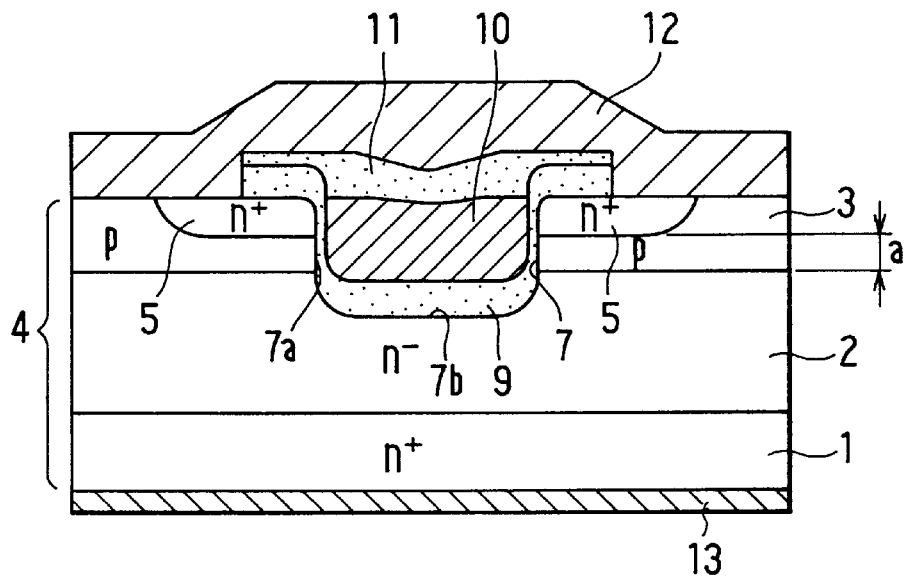
FIG. 39 is a sectional view of a trench gate type power MOSFET of the related art.
Figure 40:
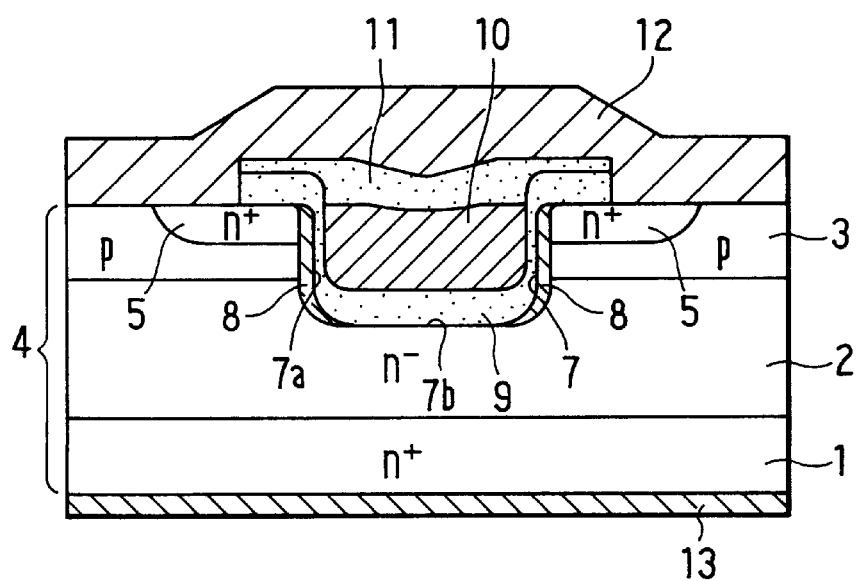
FIG. 40 is a sectional view of a trench gate type power MOSFET previously proposed by the present applicant.

Next, as shown in FIG. 38C, after an opening is formed by etching in the mask 15 in a predetermined location away from the trench 7, for example Al, which is a p-type dopant, is implanted to a predetermined depth by ion implantation to form a p-type embedded layer 14.

The mask 15 is then removed, and a p-type epitaxial layer 3 is epitaxially grown to complete a semiconductor substrate 4. An n⁺-type epitaxial layer 2a of the kind described in the second preferred embodiment is not formed in this semiconductor substrate 4.

After that, the steps of FIG. 23 onward in the second preferred embodiment are carried out on this semiconductor substrate 4 to complete a MOSFET of the construction shown in FIG. 37.

In the second and third preferred embodiments described above, the device is so constructed that a body diode (the pn junction between the p-type epitaxial layer 3 and the n⁺-type epitaxial layer 2a, or the p-type epitaxial layer 3 and the n⁻-type epitaxial layer 2) undergoes avalanche breakdown before avalanche breakdown occurs at the trench bottom. However, as another method, so-called punch-through may be made to occur, wherein a depletion layer formed between the n⁺-type epitaxial layer 2a (or the n⁻-type epitaxial layer 2) and the p-type epitaxial layer 3 reaches the n⁺-type source region 5. However, causing avalanche breakdown to occur, as in the second and third preferred embodiments described above, has the merit that it is easier to control withstand voltage than when punch-through is made to occur.

Although in the second preferred embodiment the n-type thin film semiconductor layer 8 must be formed to moderate the electric field strength of the body diode part at the trench bottom, in the third and fourth preferred embodiments, because this kind of field strength moderation is not necessary, from the point of view of making avalanche breakdown occur in the body diode first, a construction wherein the n-type thin film semiconductor layer 8 is not formed may be adopted.

The present invention is not limited to n-channel vertical type MOSFETs and can be similarly applied to a p-channel MOSFET wherein the conductive types discussed above are reversed.

What is claimed is:

1. A silicon carbide semiconductor device comprising:
   a semiconductor substrate made up of a low-resistance semiconductor layer of a first conductive type, a high-resistance semiconductor layer of the first conductive type and a first semiconductor layer of a second conductive type;
   a semiconductor region of the first conductive type formed in a predetermined region of a surface of the first semiconductor layer;
   a trench passing from a surface of the semiconductor substrate through the semiconductor region and the first semiconductor layer;
   a second semiconductor layer of the first conductive type consisting of a thin film of silicon carbide formed at least on a surface of the first semiconductor layer at a side face of the trench;
   a gate insulating film formed at least on a surface of the second semiconductor layer;

a gate electrode layer formed on the gate insulating film in the trench;

a first electrode layer formed at least on a surface of a part of the semiconductor region at the surface of the semiconductor substrate; and a second electrode layer formed on a rear side of the semiconductor substrate, wherein when a reverse bias voltage is impressed on a pn junction between the first electrode layer and the second electrode layer a pn junction between the high-resistance semiconductor layer and the first semiconductor layer undergoes avalanche breakdown before the second semiconductor layer between the high-resistance semiconductor layer and the semiconductor region suffers punch-through.

2. A silicon carbide semiconductor device comprising:

a semiconductor substrate made up of a low-resistance semiconductor layer of a first conductive type, a high-resistance semiconductor layer of the first conductive type and a first semiconductor layer of a second conductive type;

a semiconductor region of the first conductive type formed in a predetermined region of a surface of the first semiconductor layer;

a trench passing from a surface of the semiconductor substrate through the semiconductor region and the first semiconductor layer;

a second semiconductor layer of the first conductive type consisting of a thin film of silicon carbide formed at least on a surface of the first semiconductor layer at a side face of the trench;

a gate insulating film formed at least on a surface of the second semiconductor layer;

a gate electrode layer of the second conductive type formed on the gate insulating film in the trench;

a first electrode layer formed at least on a surface of a part of the semiconductor region at the surface of the semiconductor substrate; and a second electrode layer formed on a rear side of the semiconductor substrate, wherein a film thickness $X(\mu m)$ and an impurity concentration $N(cm^{-3})$ of the second semiconductor layer with respect to a withstand voltage $Y(V)$ thereof satisfy the relationship $Y<-10000\{(X-0.8)+0.3(\log N-15)\}$.

3. A silicon carbide semiconductor device comprising:

a semiconductor substrate made up of a low-resistance semiconductor layer of a first conductive type, a high-resistance semiconductor layer of the first conductive type and a first semiconductor layer of a second conductive type;

a semiconductor region of the first conductive type formed in a predetermined region of a surface of the first semiconductor layer;

a trench passing from a surface of the semiconductor substrate through the semiconductor region and the first semiconductor layer;

a second semiconductor layer of the first conductive type consisting of a thin film of silicon carbide formed at least on a surface of the first semiconductor layer at a side face of the trench;

a gate insulating film formed at least on a surface of the second semiconductor layer;

a gate electrode layer of the first conductive type formed on the gate insulating film in the trench;

a first electrode layer formed at least on a surface of a part of the semiconductor region at the surface of the semiconductor substrate; and a second electrode layer formed on a rear side of the semiconductor substrate, wherein a film thickness $X(\mu m)$ and an impurity concentration $N(cm^{-3})$ of the second semiconductor layer with respect to a withstand voltage $Y(V)$ thereof satisfy the relationship $Y<-10000\{(X-0.6)+0.3(\log N-15)\}$.

4. A silicon carbide semiconductor device comprising:

a semiconductor substrate consisting of hexagonal system monocrystalline silicon carbide and made up of a low-resistance semiconductor layer of a first conductive type, a high-resistance semiconductor layer of the first conductive type and a first semiconductor layer of a second conductive type;

a semiconductor region of the first conductive type formed in a predetermined region of a surface of the first semiconductor layer;

a trench passing from a surface of the semiconductor substrate through the semiconductor region and the first semiconductor layer and reaching the high-resistance semiconductor layer and having a side face substantially parallel with a $[1\bar{1}00]$ direction;

a second semiconductor layer consisting of a thin film of silicon carbide formed at least on a surface of the first semiconductor layer at a side face of the trench;

a gate insulating film formed at least on a surface of the second semiconductor layer;

a gate electrode layer formed on the gate insulating film in the trench;

a first electrode layer formed at least on a part of the semiconductor region at the surface of the semiconductor substrate; and a second electrode layer formed on a rear side of the semiconductor substrate.

5. A silicon carbide semiconductor device according to claim 4, wherein a shape of the trench at the surface of the semiconductor substrate is a hexagon having all its internal angles substantially equal.

6. A silicon carbide semiconductor device according to claim 4, wherein the second semiconductor layer is of the first conductive type.

7. A silicon carbide semiconductor device according to claim 5, wherein the second semiconductor layer is of the first conductive type.

8. A silicon carbide semiconductor device according to claim 6, wherein the second semiconductor layer has a film thickness of at least 250 nm and an impurity concentration of not more than $7\times10^{15}$ cm$^{-3}$.

9. A silicon carbide semiconductor device according to claim 7, wherein the second semiconductor layer has a film thickness of at least 250 nm and an impurity concentration of not more than $7\times10^{15}$ cm$^{-3}$.

10. A silicon carbide semiconductor device comprising:

a semiconductor substrate consisting of silicon carbide and made up of a low-resistance semiconductor layer of a first conductive type, a high-resistance semiconductor layer of the first conductive type and a first semiconductor layer of a second conductive type;

a semiconductor region of the first conductive type formed in a predetermined region of a surface of the first semiconductor layer;

a trench passing from a surface of the semiconductor substrate through the semiconductor region and the first semiconductor layer;

a second semiconductor layer consisting of a thin film of silicon carbide formed at least on a surface of the first semiconductor layer at a side face of the trench;

a gate oxide film formed at least on a surface of the second semiconductor layer;

a gate electrode layer formed on the gate oxide film in the trench;

a first electrode layer formed at least on a surface of a part of the semiconductor region at the surface of the semiconductor substrate; and a second electrode layer formed on a rear side of the semiconductor substrate, wherein when a reverse bias voltage is impressed on a pn junction between the first electrode layer and the second electrode layer a pn junction between the high-resistance semiconductor layer of the first conductive type and the first semiconductor layer of the second conductive type becomes conductive before a surface of the gate oxide film at a bottom of the trench undergoes avalanche breakdown.

11. A silicon carbide semiconductor device comprising:

a semiconductor substrate consisting of silicon carbide and made up of a first low-resistance semiconductor layer of a first conductive type, a high-resistance semiconductor layer of the first conductive type, a second low-resistance semiconductor layer of the first conductive type and a first semiconductor layer of a second conductive type;

a semiconductor region of the first conductive type formed in a predetermined region of a surface of the first semiconductor layer;

a trench passing from a surface of the semiconductor substrate through the semiconductor region and the first semiconductor layer and reaching at least the second low-resistance semiconductor layer;

a second semiconductor layer consisting of a thin film of silicon carbide formed at least on a surface of the first semiconductor layer at a side face of the trench;

a gate oxide film formed at least on a surface of the second semiconductor layer;

a gate electrode layer formed on the gate oxide film in the trench;

a first electrode layer formed at least on a surface of a part of the semiconductor region at the surface of the semiconductor substrate; and a second electrode layer formed on a rear side of the semiconductor substrate.

12. A silicon carbide semiconductor device according to claim 11, wherein a film thickness and an impurity concentration of the second low-resistance semiconductor layer are so set that when a reverse bias voltage is impressed on a pn junction between the first electrode layer and the second electrode layer a pn junction between the second low-resistance semiconductor layer and the first semiconductor layer undergoes avalanche breakdown before the surface of the gate oxide film at the bottom of the trench undergoes avalanche breakdown.

13. A silicon carbide semiconductor device comprising:

a semiconductor substrate consisting of silicon carbide and made up of a low-resistance semiconductor layer of a first conductive type, a high-resistance semiconductor layer of the first conductive type and a first semiconductor layer of a second conductive type;

a semiconductor region of the first conductive type formed in a predetermined region of a surface of the first semiconductor layer;

a trench passing from a surface of the semiconductor substrate through the semiconductor region and the first semiconductor layer;

a second semiconductor layer consisting of a thin film of silicon carbide formed at least on a surface of the first semiconductor layer at a side face of the trench;

a gate oxide film formed at least on a surface of the second semiconductor layer;

a gate electrode layer formed on the gate oxide film in the trench;

a first electrode layer formed at least on a surface of a part of the semiconductor region at the surface of the semiconductor substrate; and a second electrode layer formed on a rear side of the semiconductor substrate, wherein the high-resistance semiconductor layer is set to a thickness such that, when a reverse bias voltage is impressed on a pn junction between the first electrode layer and the second electrode layer and a pn junction between the high-resistance semiconductor layer and the first semiconductor layer has become conductive, a depletion layer extending from the gate oxide film toward the low-resistance semiconductor layer does not reach the low-resistance semiconductor layer.

14. A silicon carbide semiconductor device according to claim 13, wherein the high-resistance semiconductor layer is set to a thickness such that, when the reverse bias voltage is impressed on the pn junction between the first electrode layer and the second electrode layer and an electric field due to the reverse bias voltage has reached a critical electric field strength at which the pn junction between the high-resistance semiconductor layer and the first semiconductor layer undergoes avalanche breakdown, the depletion layer extending from the gate oxide film toward the low-resistance semiconductor layer does not reach the low-resistance semiconductor layer.

15. A silicon carbide semiconductor device comprising:

a semiconductor substrate consisting of silicon carbide and made up of a low-resistance semiconductor layer of a first conductive type, a high-resistance semiconductor layer of the first conductive type and a first semiconductor layer of a second conductive type;

a semiconductor region of the first conductive type formed in a predetermined region of a surface of the first semiconductor layer;

a trench passing from a surface of the semiconductor substrate through the semiconductor region and the first semiconductor layer;

a second semiconductor layer consisting of a thin film of silicon carbide formed at least on a surface of the first semiconductor layer at a side face of the trench;

a gate oxide film formed at least on a surface of the second semiconductor layer;

a gate electrode layer formed on the gate oxide film in the trench;

a first electrode layer formed at least on a surface of a part of the semiconductor region at the surface of the semiconductor substrate;

a second electrode layer formed on a rear side of the semiconductor substrate; and an embedded semiconductor layer formed in the high-resistance semiconductor layer to be away from the trench and in contact with the first semiconductor layer.

16. A silicon carbide semiconductor device according to claim 15, wherein the embedded semiconductor layer is of the first conductive type.

17. A silicon carbide semiconductor device according to claim 15, wherein the embedded semiconductor layer is of the second conductive type.

* * * * *